(12) United States Patent
Ando et al.

(10) Patent No.: US 8,395,237 B2
(45) Date of Patent: Mar. 12, 2013

(54) GROUP NITRIDE BIPOLAR TRANSISTOR

(75) Inventors: Yuji Ando, Tokyo (JP); Hironobu Miyamoto, Tokyo (JP); Tatsuo Nakayama, Tokyo (JP); Yasuhiro Okamoto, Tokyo (JP); Takashi Inoue, Tokyo (JP); Kazuki Ota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/124,872

(22) PCT Filed: Oct. 16, 2009

(86) PCT No.: PCT/JP2009/067907
§ 371 (c)(1),
(2), (4) Date: Jun. 16, 2011

(87) PCT Pub. No.: WO2010/047280
PCT Pub. Date: Apr. 29, 2010

(65) Prior Publication Data
US 2011/0241075 A1    Oct. 6, 2011

(30) Foreign Application Priority Data

Oct. 21, 2008  (JP) ................................. 2008-270883

(51) Int. Cl.
*H01L 29/66* (2006.01)
*H01L 29/737* (2006.01)

(52) U.S. Cl. . 257/565; 257/197; 257/198; 257/E29.183; 257/E29.185; 257/E29.186; 257/E29.188; 257/E29.189

(58) Field of Classification Search ............. 257/197, 257/198, 565, E29.183, E29.185, E29.186, 257/E29.188, E29.189
See application file for complete search history.

(56) References Cited

U.S. PATENT DOCUMENTS

| 5,412,233 A | * | 5/1995 | Dubon-Chevallier et al. ........................ 257/197 |
| 5,689,122 A | * | 11/1997 | Chandrasekhar ............. 257/184 |
| 5,767,540 A | * | 6/1998 | Shimizu ........................ 257/197 |
| 5,828,087 A | * | 10/1998 | Takahashi ....................... 257/96 |

(Continued)

FOREIGN PATENT DOCUMENTS

| JP | 1-132160 A | 5/1989 |
| JP | 1-144681 A | 6/1989 |

(Continued)

OTHER PUBLICATIONS

International Search Report for PCT/JP2009/067907 mailed Nov. 17, 2009.

(Continued)

*Primary Examiner* — Ida M Soward

(57) ABSTRACT

A bipolar transistor includes: a substrate; a collector and a base layer with a p-conductive-type, an emitter layer with an n-conductive-type. The collector layer is formed above the substrate and includes a first nitride semiconductor. The base layer with the p-conductive-type is formed on the collector layer and includes a second nit ride semiconductor. The emitter layer with the n-conductive-type is formed on the base layer and includes a third nitride semiconductor. The collector layer, the base layer and the emitter layer are formed so that crystal growing directions with respect to a surface of the substrate are in parallel to a [0001] direction of the substrate. The first nitride semiconductor includes: $In_{yc}Al_{xc}Ga_{1-xc-yc}N$ ($0 \leq xc \leq 1$, $0 \leq yc \leq 1$, $0 < xc+yc \leq 1$). In the first nitride semiconductor, a length of an a-axis on a surface side is longer than a length of an a-axis on a substrate side.

11 Claims, 22 Drawing Sheets

U.S. PATENT DOCUMENTS

| | | | |
|---|---|---|---|
| 6,348,704 B1* | 2/2002 | Teraguchi | 257/197 |
| 6,683,332 B2* | 1/2004 | Shinozaki et al. | 257/186 |
| 6,806,513 B2* | 10/2004 | Chau et al. | 257/198 |
| 6,881,988 B2* | 4/2005 | Niwa et al. | 257/197 |
| 7,242,038 B2* | 7/2007 | Oda et al. | 257/197 |
| 7,297,989 B2* | 11/2007 | Otani et al. | 257/103 |
| 7,569,910 B2* | 8/2009 | Chang et al. | 257/565 |
| 8,101,973 B2* | 1/2012 | O'Keefe et al. | 257/197 |
| 2003/0157376 A1* | 8/2003 | Vaudo et al. | 428/698 |
| 2005/0118746 A1* | 6/2005 | Sumakeris et al. | 438/105 |
| 2006/0236923 A1* | 10/2006 | Kouvetakis et al. | 117/108 |
| 2006/0286695 A1* | 12/2006 | Yanashima et al. | 438/22 |
| 2008/0113497 A1* | 5/2008 | Tachibana et al. | 438/483 |
| 2009/0065811 A1* | 3/2009 | Chang et al. | 257/197 |
| 2010/0001290 A1* | 1/2010 | Nonaka | 257/77 |

FOREIGN PATENT DOCUMENTS

| | | |
|---|---|---|
| JP | 2003518776 A | 6/2003 |
| JP | 2004140339 A | 5/2004 |
| JP | 2006128554 A | 5/2006 |
| JP | 2006253503 A | 9/2006 |
| JP | 2007188991 A | 7/2007 |
| JP | 2008004779 A | 1/2008 |
| WO | 2004061971 A | 7/2004 |

OTHER PUBLICATIONS

L. S. McCarthy et al., "AlGaN/GaN Heterojunction Bipolar Transistor", IEEE Electron Device Letters, vol. 20, No. 6, Jun. 1999, pp. 277-279.

* cited by examiner

GROUP NITRIDE BIPOLAR TRANSISTOR

This application is the National Phase of PCT/JP2009/067907, filed Oct. 16, 2009, which is based upon and claims the benefit of priority from Japanese patent application No. 2008-270883 filed on Oct. 21, 2008, the disclosure of which is incorporated herein in its entirety by reference.

TECHNICAL FIELD

The present invention relates to a bipolar transistor, and more particularly relates to a bipolar transistor containing a group III nitride semiconductor as a main material.

BACKGROUND ART

There is known a bipolar transistor containing a group III nitride semiconductor as a main material. FIG. 1 is a sectional view showing a typical configuration of a bipolar transistor. Such a bipolar transistor is reported in, e.g., L. S. McCarthy et al., "AlGaN/GaN Heterojunction Bipolar Transistor", IEEE Electron Device Letters, Vol. 20, No. 6, pp. 277, (1999).

In FIG. 1, the bipolar transistor includes a sapphire substrate 100, a sub-collector layer 103 including high density n-type GaN, a collector layer 104 including low density n-type GaN, a base layer 105 including p-type GaN and an emitter layer 106 including n-type $Al_{0.1}Ga_{0.9}N$. A crystal growing direction with respect to a substrate surface is in parallel to a [0001] direction. An emitter electrode 10E contacting the n-type AlGaN emitter layer 106, a base electrode 10B contacting the p-type GaN base layer 105 and a collector electrode 10C contacting the n-type GaN sub-collector 103 are respectively formed.

As a related technique, a p-type nitride semiconductor structure and a bipolar transistor are disclosed in the international patent publication No. WO2004/061971 (corresponding to U.S. patent publication: US2005/224831(A1)). This p-type nitride semiconductor structure is provided with a p-type nitride semiconductor layer including In that is re-grown on the p-type nitride semiconductor subjected to an etching process.

Further, a bipolar transistor and a manufacturing method thereof are disclosed in Japanese patent publication No. JP2006-128554(A). This bipolar transistor includes a first semiconductor layer, a second semiconductor layer and a third semiconductor layer. This bipolar transistor is provided with an insulating film having an opening portion formed under the second semiconductor layer and a part of the first semiconductor layer formed in contact under the insulating film.

Further, a nitride semiconductor bipolar transistor and a manufacturing method of a nitride semiconductor bipolar transistor are disclosed in Japanese patent publication No. JP2008-4779(A). This nitride semiconductor bipolar transistor is provided with a nitride semiconductor layer formed in contact with an emitter electrode or a collector electrode, including InAlGaN quaternary mixed crystal.

This time, the inventors have now discovered the following facts. FIG. 2 is a diagram showing an energy band of the bipolar transistor shown in FIG. 1. This diagram of the energy band shows the case where a forward bias is applied between the base and the emitter and a reverse bias is applied between the base and the collector. According to a band calculation, it is known that there exist an L-M valley and a second gamma (Γ) valley in high energy side by approximately 2.0 eV from a bottom of a conduction band of GaN, i.e., gamma (Γ) valley. These are collectively called "upper valley" depicted in FIG. 2 (represented by a dashed line in the figure).

As shown in FIG. 2, an electric field intensity becomes maximum in the vicinity of an interface between the base layer 105 and the collector layer 104 in the bipolar transistor shown in FIG. 1. Therefore, electrons injected to the collector layer 104 from the base layer 105 become high energy and undergo phonon scattering to be easily transited to the upper valley. Consequently, this bipolar transistor has a tendency that a carrier speed at a high voltage operation is lowered so as to lower a cutoff frequency. Moreover, since electrons are apt to have high energy within the collector layer 104 and GaN composing the collector layer 104 has a relatively narrow band gap, an avalanche breakdown easily occurs. Therefore, this bipolar transistor is involved with a problem that a collector breakdown voltage is low.

CITATION LIST

Patent Literature

[PTL 1] WO2004/061971
[PTL 2] JP2006-128554A
[PTL 3] JP2008-4779A

Non Patent Literature

[NPL 1] L. S. McCarthy et al., "AlGaN/GaN Heterojunction Bipolar Transistor", IEEE Electron Device Letters, Vol. 20, No. 6, pp. 277, (1999).

SUMMARY OF INVENTION

An object of the present invention is to provide a bipolar transistor having a high collector breakdown voltage and an excellent electron transport characteristic even under a high voltage while solving the problems mentioned above.

A bipolar transistor of the pre sent invention includes a substrate, a collector layer, a p-conductive-type base layer and an n-conductive-type emitter layer. The collector layer is formed above the substrate and includes a first nitride semiconductor. The p-conductive-type base layer is formed on the collector layer and includes a second nitride semiconductor. The n-conductive-type emitter layer is formed on the base layer and includes a third nitride semiconductor. The collector layer, the base layer and the emitter layer are formed so that crystal growing directions with respect to a surface of the substrate are in parallel to a [0001] direction of the substrate. The first nitride semiconductor includes $In_{yc}Al_{xc}Ga_{1-xc-yc}N$ ($0 \leq xc \leq 1$, $0 \leq yc \leq 1$, $0 < xc+yc \leq 1$). A length of an a-axis on a surface side in the first nitride semiconductor is longer than a length of an a-axis on a substrate side.

According to the present invention, it is possible is to provide a bipolar transistor having a high collector breakdown voltage and an excellent electron transport characteristic even under a high voltage.

BRIEF DESCRIPTION OF DRAWINGS

The above and other objects, advantages and features of the present invention will be more apparent from the following description of certain preferred exemplary embodiments taken in conjunction with the accompanying drawings, in which.

DESCRIPTION OF EMBODIMENTS

Exemplary embodiments of a bipolar transistor of the present invention will be described below with reference to the accompanying drawings.

(First Exemplary Embodiment)

Figure 1:
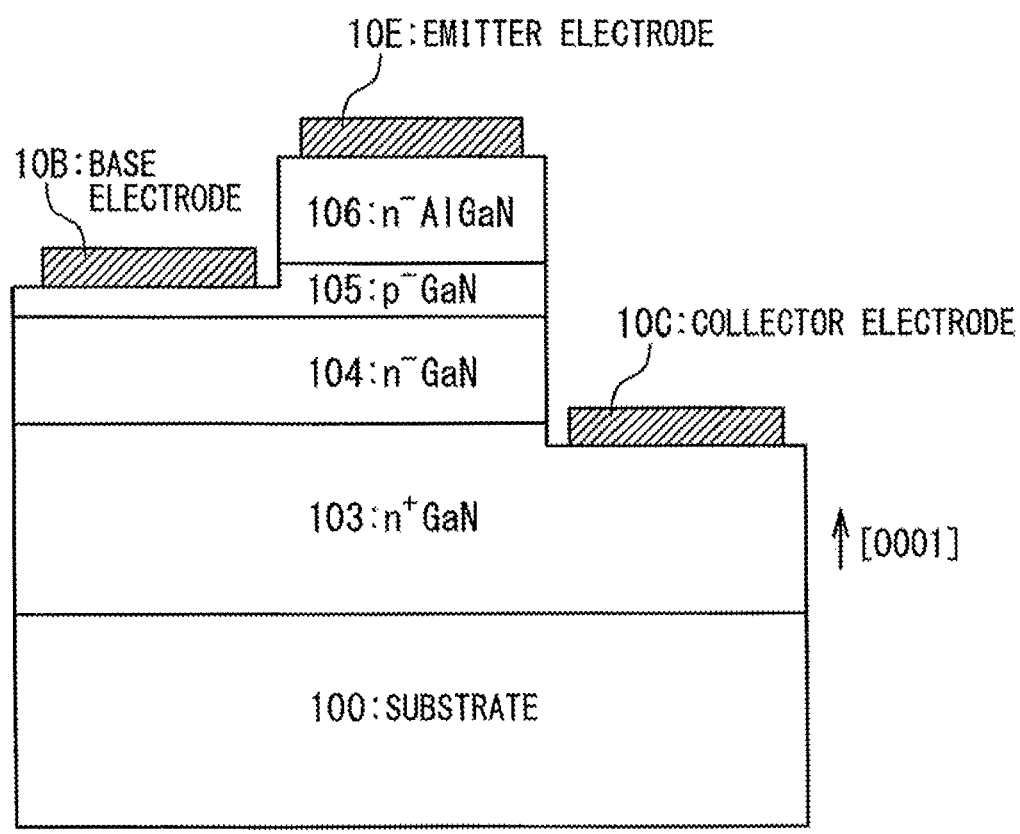
FIG. 1 is a sectional view showing a typical configuration of a bipolar transistor.
Figure 2:
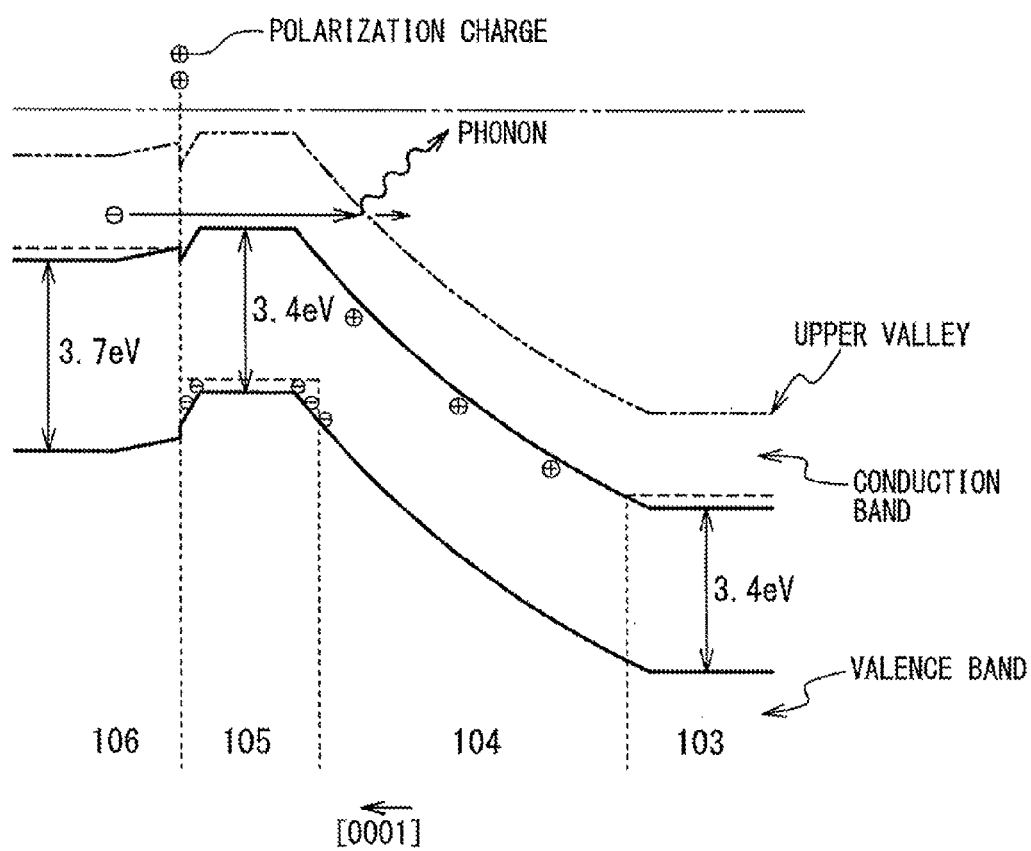
FIG. 2 is a diagram showing an energy band of the bipolar transistor shown in FIG. 1.
Figure 3:
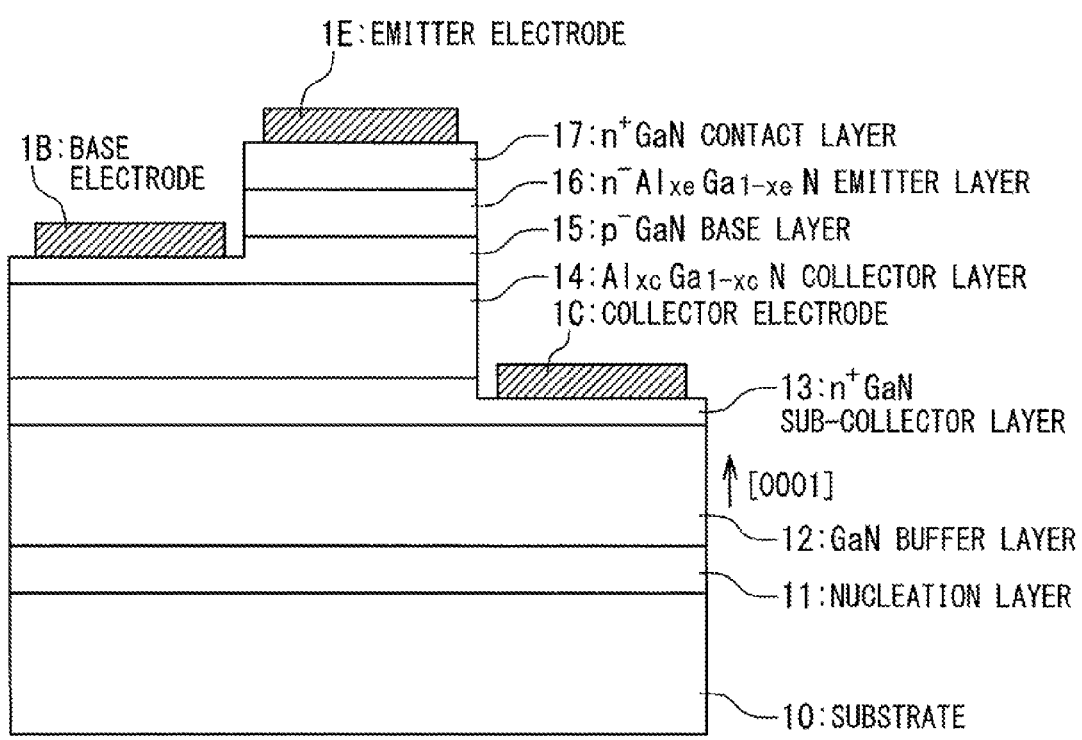
FIG. 3 is a sectional view showing a configuration of a bipolar transistor according to a first exemplary embodiment of the present invention.

A configuration of a bipolar transistor according to a first exemplary embodiment of the present invention will be described. FIG. 3 is a sectional view showing a configuration of the bipolar transistor according to the first exemplary embodiment of the present invention. As shown in FIG. 3, the bipolar transistor includes a substrate 10, a nucleation layer 11, a buffer layer 12, a sub-collector layer 13, a collector layer 14, a base layer 15, an emitter layer 16, a contact layer 17, an emitter electrode 1E, a base electrode 1B and a collector electrode 1C.

The substrate 10 is a (0001) plane silicon carbide (SiC) substrate. The nucleation layer 11 is formed on the substrate 10 and includes AlN. The buffer layer 12 is formed on the nucleation layer 11 and includes undoped GaN. The sub-collector layer 13 is formed on the buffer layer 12 and includes high density n-type GaN. The collector layer 14 is formed on the sub-collector layer 13 and includes undoped AlGaN. The base layer 15 is formed on the collector layer 14 and includes p-type GaN. The emitter layer 16 is formed on the base layer 15 and includes n-type AlGaN. The contact layer 17 is formed on the emitter layer 16 and includes high density n-type GaN. The emitter electrode 1E is formed in contact on the contact layer 17 (n-type GaN layer). The base electrode 1B is formed in contact on the base layer 15 (p-type GaN layer). The collector electrode 1C is formed in contact on the sub-collector layer 13 (n-type GaN layer). Each of the electrodes is brought into ohmic contact.

The bipolar transistor is manufactured in manufacturing processes (A) and (B) as follows. (A) Initially, each of layers of which materials and film thicknesses are denoted below is sequentially laminated and grown in the order from the upper to the lower denoted below on the (0001) plane of the SiC substrate 10 by a method of, e.g., Metalorganic Chemical Vapor Deposition (referred to as "MOCVD", hereinafter).

(A-1) The nucleation layer 11: Undoped AlN, 200 nm. (A-2) The buffer layer 12: Undoped GaN, 1 µm. (A-3) The sub-collector layer 13: n-type GaN (Si: $3\times10^{18}$ cm$^{-3}$), 1 µm. (A-4) The collector layer 14: Undoped $Al_{xc}Ga_{1-xc}N$ (xc=xc1 to xc2), 500 nm. (A-5) The base layer 15: p-type GaN (Mg: $1\times10^{19}$ cm$^{-3}$), 100 nm. (A-6) The emitter layer 16: n-type $Al_{xe}Ga_{1-xe}N$ (Si: $5\times10^{17}$ cm$^{-3}$), 500 nm. (A-7) The contact layer 17: N-type GaN (Si: $1\times10^{19}$ cm$^{-3}$), 50 nm. In these films, the crystal growing directions are in parallel to the [0001] direction of the substrate.

Here, the collector layer 14 which is an AlGaN layer has an inclined composition structure or a step-wise composition structure in which the Al composition xc is modulated in a film-thickness direction. For example, in the collector layer 14, the Al composition is assumed to be xc=xc1 at an interface with respect to the sub-collector layer 13 which is an n-type GaN layer and the Al composition is assumed to be xc=xc2 at an interface with respect to the base layer 15 which is a p-type GaN layer. In this case, $0 \leqq xc2 < xc1 \leqq 1$ is established. That is, the Al composition xc of the collector layer 14 is reduced toward the base layer 15 from the sub-collector layer 13. The collector layer 14 is thinner than a critical thickness of dislocation generation and becomes a strain lattice layer. From a viewpoint of suppressing the dislocation generation of the collector layer 14 and obtaining a good crystal quality, it is preferable to establish $0 \leqq xc2 < xc1 \leqq 0.5$. In the case of the present exemplary embodiment, assuming that, for example, xc1=0.2 and xc2=0 and the thickness of the collector layer 14 is equal to or smaller than 1 μm, the thickness becomes within the critical thickness of the dislocation generation.

Further, it is assumed that the Al composition xe of the emitter layer 16 which is an AlGaN layer is set to $0 \leqq xe \leqq 1$. From a viewpoint of suppressing dislocation generation of the emitter layer 16 and obtaining a good crystal quality, it is preferable to establish $0 \leqq xe \leqq 0.5$. In the case of the present exemplary embodiment, assuming that, for example, xe=0.1 and the thickness of the emitter layer 16 is equal to or smaller than 1 μm, the thickness becomes within the critical thickness of the dislocation generation.

Further, silicon (Si) is used as an n-type impurity. Magnesium (Mg) is used as a p-type impurity. However, beryllium (Be) maybe used as the p-type impurity. Although the AlGaN layer as the collector layer 14 is undoped, an n-type one with an impurity density in a degree of $1 \times 10^{17}$ cm$^{-3}$ or lower may be used.

(B) Subsequently, the lamination structure formed in the process (A) is subjected to a patterning process in the order denoted as following to form each of the electrodes so that the bipolar transistor is manufactured.

(B-1) Initially, for example, a silicon dioxide (SiO$_2$) film is formed using a chemical vapor deposition (referred to as "CVD", hereinafter) method. (B-2) Subsequently, a patterning process of an emitter mesa region (pattern formation having an opening portion in a region expected for forming a base electrode) is carried out with respect to the SiO$_2$ film. (B-3) Thereafter, with the patterned SiO$_2$ film as a mask, the contact layer 17 and the emitter layer 16 are partly etched off (i.e., emitter mesa etching) by a reactive ion etching (referred to as "RIE", hereinafter) method using, e.g., a chlorine (Cl$_2$) based gas. Thus, the base layer 15 which is the p-type GaN layer is exposed so as to form an external base region. (B-4) Next, e.g., metals such as palladium (Pd)/gold (Au) are evaporated in the external base region. (B-5) Thereafter, the base electrode 1B is formed by lifting off the SiO$_2$ film. It is noted that other materials such as titanium (Ti)/Au may be used as the material of the p-type ohmic electrode.

(B-6) Next, the SiO$_2$ film is formed using the CVD method again. (B-7) Subsequently, a patterning process of a base mesa region (pattern formation having an opening portion in a region expected for forming a collector electrode) is carried out with respect to the SiO$_2$ film. (B-8) Thereafter, with the patterned SiO$_2$ film as a mask, the contact layer 17, the emitter layer 16, the base layer 15 and the collector layer 14 are partly etched off (i.e., base mesa etching) by a RIE method using, e.g., a Cl$_2$-based gas. Thus, the sub-collector layer 13 which is the n-type GaN layer is exposed so as to form an external collector region. (B-9) Subsequently, an opening portion is formed in the region expected for forming the emitter electrode with respect to the SiO$_2$ film. (B-10) Next, e.g., metals such as Ti/aluminum (Al)/nickel (Ni)/Au are evaporated in the emitter mesa region and the external collector region. (B-11) Thereafter, the emitter electrode 1E and the collector electrode 1C are respectively formed by lifting off the SiO$_2$ film. It is noted that other materials such as Ti/Al/molybdenum (Mo)/Au or Ti/Al/niobium (Nb)/Au may be used as the material of the n-type ohmic electrode.

(B-12) Finally, an alloy treatment is subjected to the entire part. Thus, each of the emitter electrode 1E, the base electrode 1B and the collector electrode 1C is brought into ohmic contact.

Thus, the bipolar transistor as shown in FIG. 3 is manufactured.

Figure 4A:
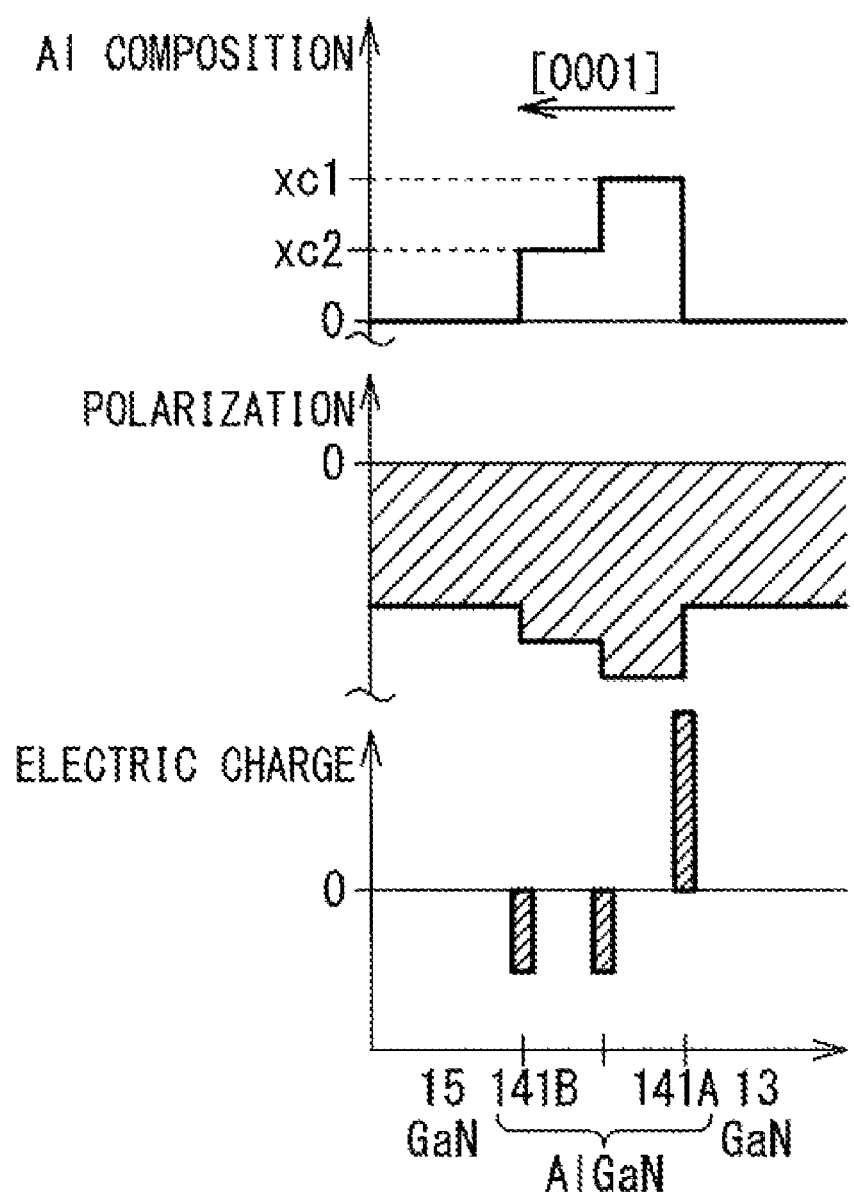
FIG. 4A is a graph showing a representative example of an Al composition distribution, a polarization amount distribution and an electric charge distribution in the bipolar transistor according to the first exemplary embodiment of the present invention.
Figure 4B:
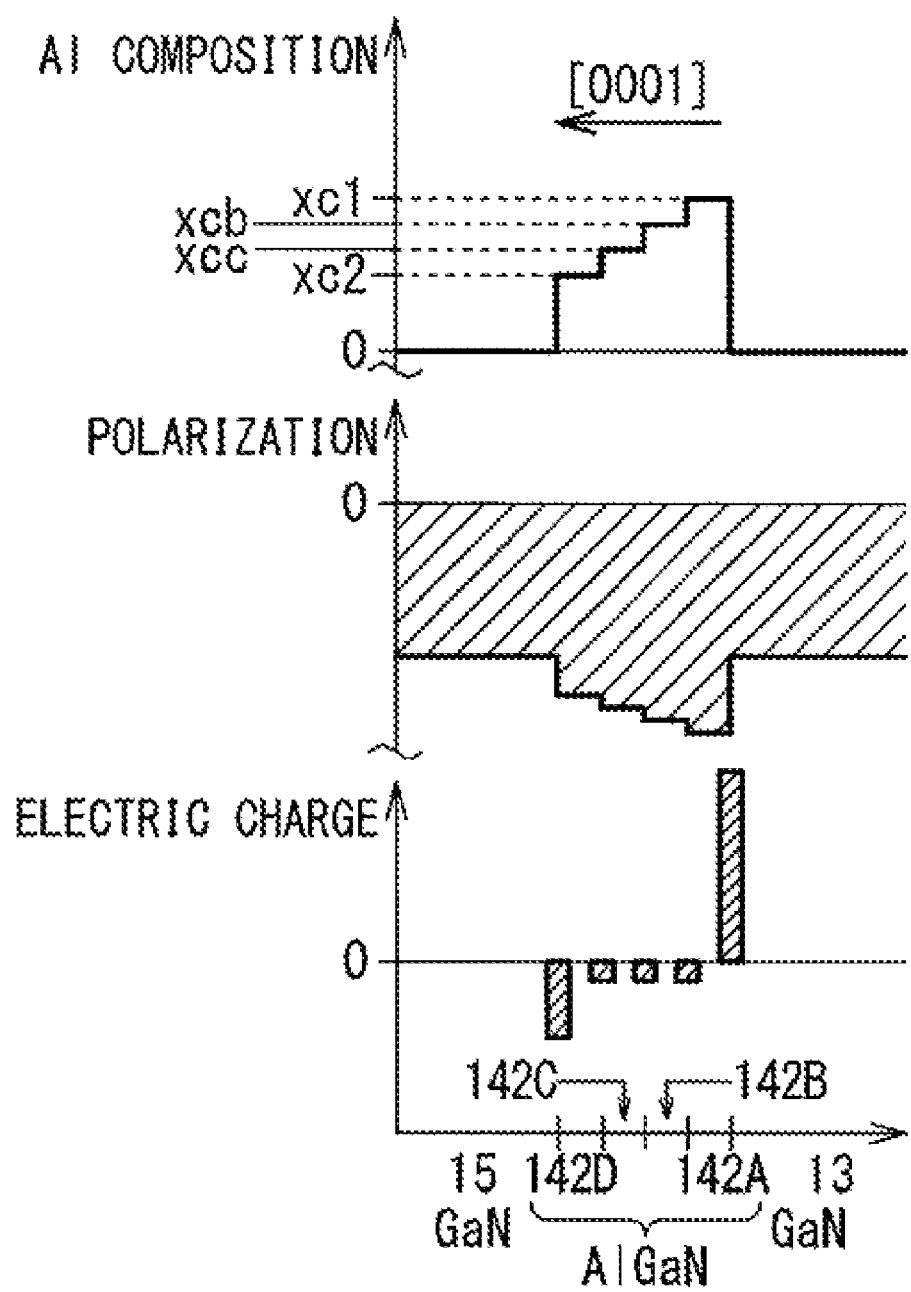
FIG. 4B is a graph showing a representative example of an Al composition distribution, a polarization amount distribution and an electric charge distribution in the bipolar transistor according to the first exemplary embodiment of the present invention.
Figure 4C:
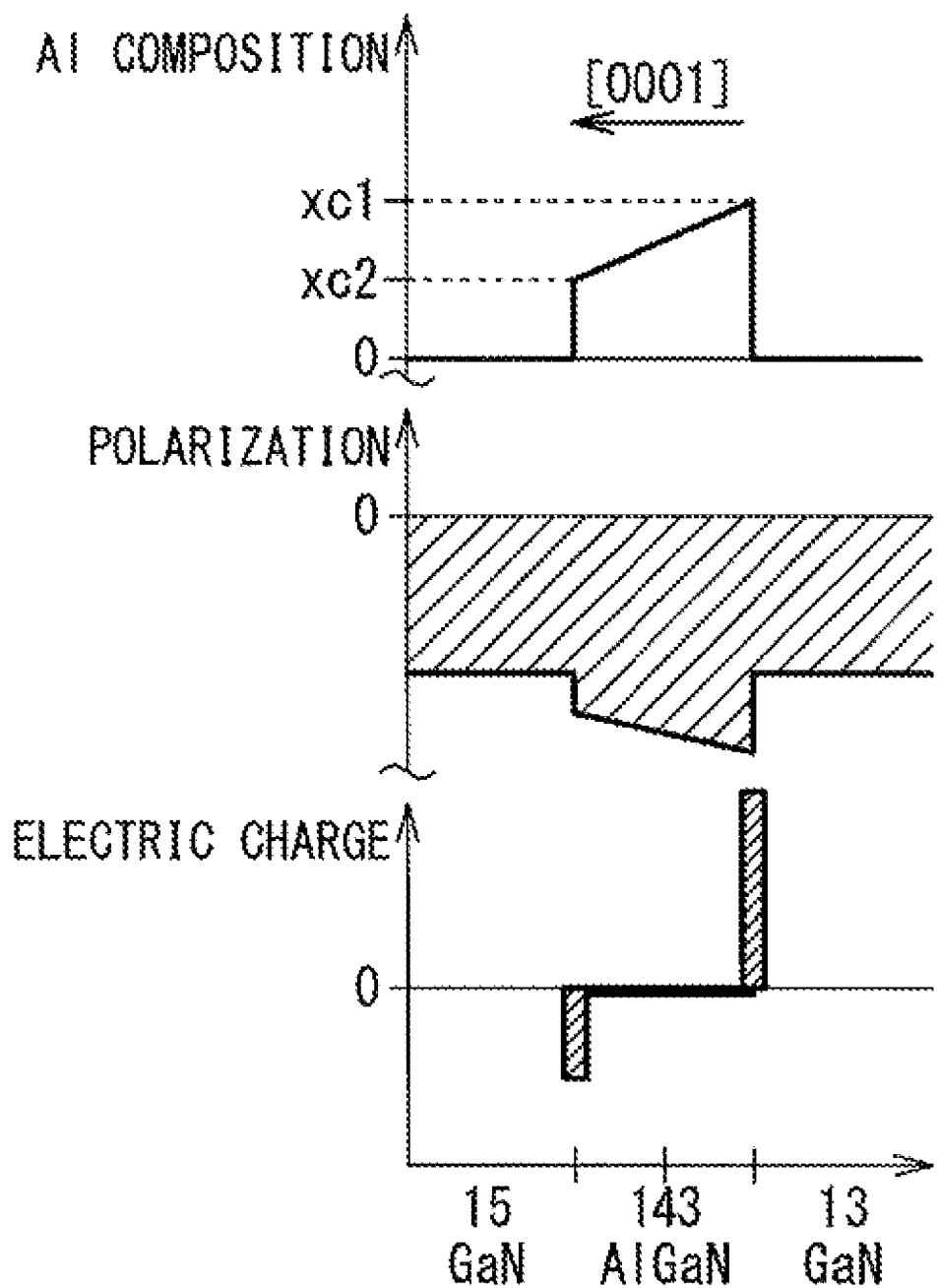
FIG. 4C is a graph showing a representative example of an Al composition distribution, a polarization amount distribution and an electric charge distribution in the bipolar transistor according to the first exemplary embodiment of the present invention.

FIGS. 4A to 4C are graphs each showing a representative example of an Al composition distribution, a polarization amount distribution and an electric charge distribution in the bipolar transistor according to the first exemplary embodiment of the present invention. Here, in the figures, the crystal composition of the collector layer 14 (AlGaN layer) is selected so that an a-axis length on the surface side is longer than an a-axis length on the substrate side. For example, it is selected so that the a-axis length increases toward the base layer 15 from the sub-collector layer 13. Further, vertical axes respectively and separately indicate an Al composition, polarization and electric charge in the order from the top. A horizontal axis indicates positions (of the base layer 15 (GaN layer), collector layer 14 (AlGaN layer) and sub-collector layer 13 (GaN layer), respectively) in the bipolar transistor.

FIG. 4A shows the case where the collector layer 14 an $Al_{xc1}Ga_{1-xc1}N$ layer 141A and an $Al_{xc2}Ga_{1-xc2}N$ layer 141B in (AlGaN layer) has a two-layer structure that is formed of this order. Here, $0 \leqq xc2 < xc1 \leqq 1$ is established as shown in the upper graph. In the case of a (0001) plane growing, a tensile strain is generated within the AlGaN layer (collector layer 14) on the GaN layer (sub-collector layer 13) and a negative polarization is generated within the AlGaN layer (collector layer 14). Here, a sign of the polarization is assumed to be positive in the case of the surface side being positively charged. In the case of the present exemplary embodiment, the a-axis length increases toward the base layer 15 from the sub-collector layer 13. Therefore, as shown in the intermediate graph, a piezo polarization is varied in a direction of cancelling (reducing) the negative polarization toward the base layer 15 from the sub-collector layer 13. Then, since space charges corresponding to a discontinuous amount of the polarization value are generated as shown in the lower graph, positive electric charges are generated at an interface between the sub-collector layer 13 (GaN layer) and the AlGaN layer 141A. Negative electric charges are generated at an interface between the AlGaN layer 141A and the AlGaN layer 141B and at an interface between the AlGaN layer 141B and the base layer 15 (GaN layer), respectively.

For example, in the case of xc1=0.2 and xc2=0.1, positive electric charges having a surface density of $1.1 \times 10^{13}$ cm$^{-2}$ are generated at an interface between the sub-collector 13 (GaN layer) and the AlGaN layer 141A. Negative electric charges having a surface density of $5.4 \times 10^{12}$ cm$^{-2}$ are generated at an interface between the AlGaN layer 141A and the AlGaN layer 141B and at an interface between the AlGaN layer 141B and the base layer 15 (GaN layer), respectively.

FIG. 4B shows the case where the collector layer 14 (AlGaN layer) has a four-layer structure that is formed of an $Al_{xc1}Ga_{1-xc1}N$ layer 142A, an $Al_{xcb}Ga_{1-xcb}N$ layer 142B, an $Al_{xcc}Ga_{1-xcc}N$ layer 142C and an $Al_{xc2}Ga_{1-xc2}N$ layer 142D in this order. Here, $0 \leqq xc2 < xcc < xcb < xc1 \leqq 1$ is established as shown in the upper graph. In the case of the present exemplary embodiment, the a-axis length increases toward the base layer 15 from the sub-collector 13. Therefore, also in this case, as shown in the intermediate graph, a piezo polarization is varied in a direction of cancelling (reducing) the negative polarization toward the base layer 15 from the sub-collector layer 13. Then, since space charges corresponding to a discontinuous amount of the polarization value are generated as shown in the lower graph, positive electric charges are generated at an interface between the sub-collector layer 13 (GaN layer) and the AlGaN layer 142A. Negative electric charges are generated at an interface between the AlGaN layer 142A and the AlGaN layer 142B, at an interface between the AlGaN layer 142B and the AlGaN layer 142C, at an interface between the AlGaN layer 142C and the AlGaN layer 142D and at an interface between the AlGaN layer 142D and the base layer 15 (GaN layer), respectively.

For example, in the case of xc1=0.2, xcb=0.15, xcc=0.1, and xc2=0.05, positive electric charges having a surface density of $1.1 \times 10^{13}$ cm$^{-2}$ are generated at an interface between the sub-collector 13 (GaN layer) and the AlGaN layer 142A. Negative electric charges having a surface density of $2.7 \times 10^{12}$ cm$^{-2}$ are generated at an interface between the AlGaN layer 142A and the AlGaN layer 142B, at an interface between the AlGaN layer 142B and the AlGaN layer 142C, at an interface between the AlGaN layer 142C and the AlGaN layer 142D and at an interface between the AlGaN layer 142D and the base layer 15 (GaN layer), respectively.

FIG. 4C shows the case where the collector layer 14 (AlGaN layer) includes an inclined composition AlGaN layer 143 so that the Al composition xc is gradually reduced from xc1 to xc2 toward the base layer 15 (GaN layer) from the sub-collector layer 13 (GaN layer). Herein, $0 \leqq xc2 < xc1 \leqq 1$ is established as shown in an upper graph. This corresponds to the case where the number of steps of the step-wise composition structure in FIG. 4B is very large. Therefore, as shown in the intermediate graph, the polarization amount of the AlGaN layer 143 is smoothly varied. Thus, negative electric charges are continuously generated within the AlGaN layer 143 as shown in the lower graph.

For example, in the case where a thickness of the inclined composition AlGaN layer 143 is 500 nm under the condition of xc1=0.2 and xc2=0, positive electric charges having a surface density of $1.1 \times 10^{13}$ cm$^{-2}$ are generated at an interface between the sub-collector 13 (GaN layer) and the AlGaN layer 143. Negative electric charges having a volume density of $2.2 \times 10^{17}$ cm$^{-3}$ are generated within the AlGaN layer 143.

Figure 5:
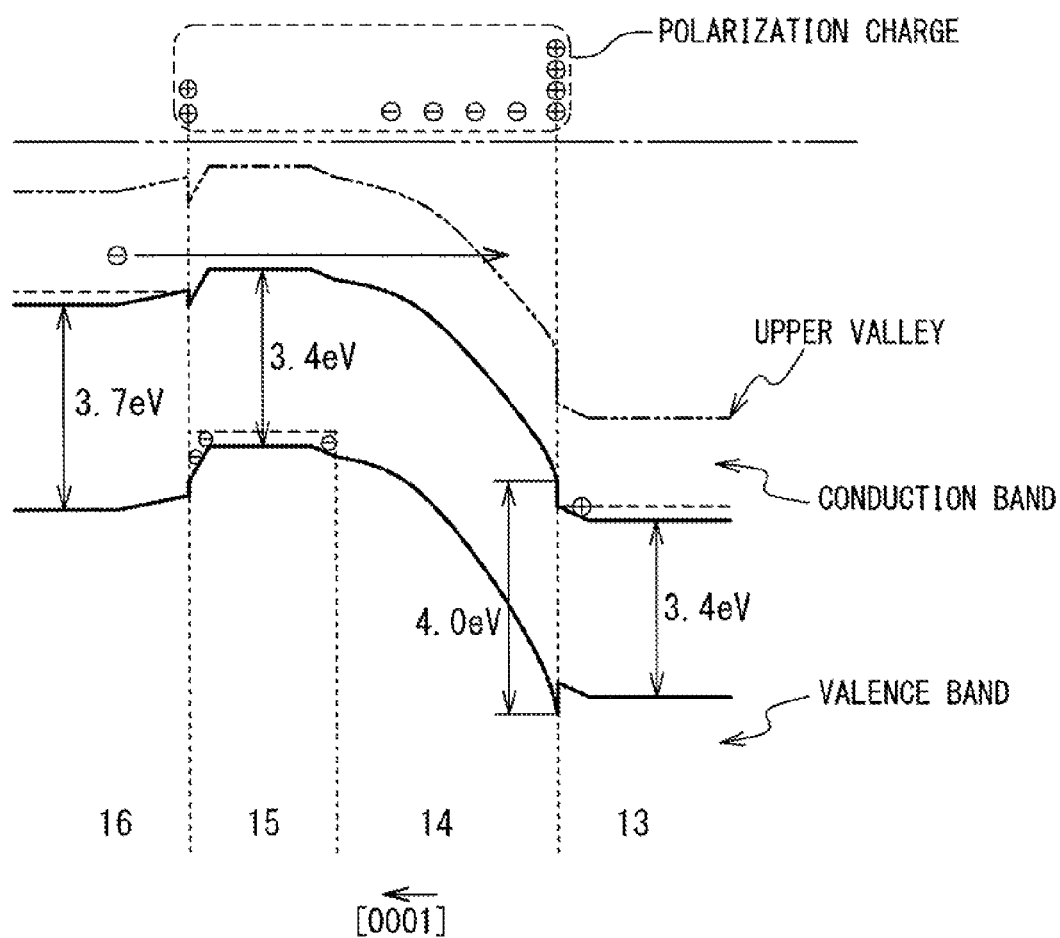
FIG. 5 is a diagram showing an example of an energy band of the bipolar transistor according to the first exemplary embodiment of the present invention.

As described above, since the negative electric charges are generated within the collector layer 14 (AlGaN layer) in any of the cases shown in FIGS. 4A, 4B and 4C, there can be obtained an effect similar to that in the case of executing a p-type doping. The case of FIG. 4C is further described as one example. FIG. 5 shows an example of an energy band diagram of the bipolar transistor according to the first exemplary embodiment of the present invention. This energy band diagram shows the case where a forward bias is applied between the base and the emitter (i.e., between the base layer 15 and the emitter layer 16) and a reverse bias is applied between the base and the collector (i.e., between the base layer 15 and the collector layer 14) under the condition of xe=0.1, xc1=0.2 and xc2=0 in FIG. 4C. Here, regarding "polarization charges" depicted in the upper portion of the figure, generation positions of the polarization charges generated in a valence band (represented by approximate positions in the sub-collector layer 13, collector layer 14, base layer 15 and emitter layer 16) and relative amounts (represented by approximate numbers of plus charges and minus charges) thereof are schematically illustrated (similarly illustrated in FIGS. 7, 9, 11, 13, 15, 18 and 2).

An internal electric field having a convex potential protruded upward with respect to electrons is generated within the collector layer 14 (AlGaN layer). Thus, the electric field concentration at the interface between the base and the collector (i.e., between the base layer 15 and the collector layer 14) is released. Simultaneously, since the position at which the electric field intensity is maximum is shifted to aside of the sub-collector layer 13, it becomes difficult for the electrons injected into the collector layer 14 from the base layer 15 to be high energy. Thus, valley scatterings are suppressed to thereby increase a carrier speed so that a cut-off frequency is improved.

Further, a band gap of the collector layer 14 (AlGaN layer) becomes large in a side of the sub-collector layer 13. The position at which the electric field intensity is maximum is also shifted to a side of the sub-collector layer 13. Therefore, the band gap in the position at which the electric field is maximum becomes large so that an avalanche breakdown is suppressed from occurring. Thus, the collector breakdown voltage can be also improved.

In the present exemplary embodiment, the contact layer 17 of an n-type GaN layer is formed in contact on the emitter layer 16 of an n-type AlGaN layer. However, it may be also possible that an inclined composition AlGaN layer is inserted to an interface between the emitter layer 16 and the contact layer 17 so that the Al composition may be smoothly reduced from the emitter layer 16 toward the contact layer 17. In this case, a barrier to the electrons due to a conduction band offset of a hetero junction becomes small so that an emitter resistance is reduced.

Further, although the base electrode 1B is formed in contact on the base layer 15 of the p-type GaN layer, the base electrode may be formed via a p-type GaN layer or a p-type InGaN layer selectively re-grown only on an external base region. In this case, since a crystal damage of an external base layer by a RIE using an emitter mesa formation can be recovered by an annealing process, the base resistance is reduced.

Moreover, it may be also possible that the collector layer 14 and the sub-collector layer 13 below the external base region are ion implanted with such as nitride (N) or boron (B) to have a high resistivity so that an insulating region may be formed. Alternatively, the collector layer 14 and the sub-collector layer 13 in the same position may be removed by etching. In these cases, a base-collector capacitance is reduced so that a switching speed can be improved.

(Second Exemplary Embodiment)

Figure 6:
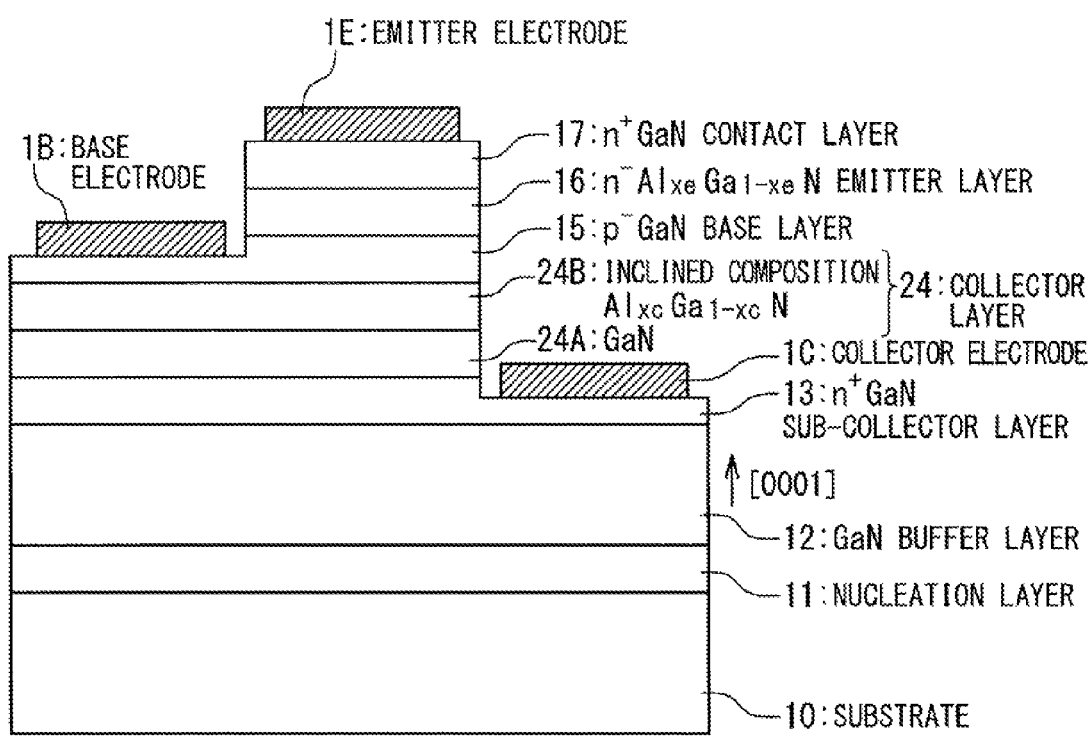
FIG. 6 is a sectional view showing a configuration of a bipolar transistor according to a second exemplary embodiment of the present invention.

A configuration of a bipolar transistor according to a second exemplary embodiment of the present invention will be described below. FIG. 6 is a sectional view showing a configuration of the bipolar transistor according to the second exemplary embodiment of the present invention. In the first exemplary embodiment, the thickness of the collector layer 14 (AlGaN layer) is restricted to a critical thickness of dislocation generation. Therefore, the collector layer 14 cannot be fully thick and the collector breakdown voltage is restricted. In the second exemplary embodiment, such a restriction of the collector breakdown voltage can be removed.

As shown in FIG. 6, the bipolar transistor includes the substrate 10, the nucleation layer 11, the buffer layer 12, the sub-collector layer 13, a collector layer 24, the base layer 15, the emitter layer 16, the contact layer 17, the emitter electrode 1E, the base electrode 1B and the collector electrode 1C.

In the present exemplary embodiment, the collector layer 14 in the bipolar transistor in the first exemplary embodiment is replaced with the collector layer 24. The collector layer 24 has a two-layer structure of an undoped GaN layer 24A and an undoped inclined composition $Al_{xc}Ga_{1-xc}N$ layer 24B that are laminated in this order.

The Al composition xc of the inclined composition $Al_{xc}Ga_{1-xc}N$ layer 24B is gradually reduced from xc1 to xc2 toward the base layer 15 (p-type GaN layer) from the GaN layer 24A. Here, $0 \leqq xc2 < xc1 < 1$ is established. The state of this inclined composition $Al_{xc}Ga_{1-xc}N$ layer 24B is exemplified as a state of the collector layer 14 (AlGaN layer) in FIG. 4C. For example, a thickness of the GaN layer 24A is 200 nm and a thickness of the inclined composition $Al_{xc}Ga_{1-xc}N$ layer 24B is 500 nm under the condition of xc1=0.2 and xc2=0. Herein, the thickness of the inclined AlGaN layer 24B is the critical thickness of the dislocation generation or less. The manufacturing method of the present bipolar transistor is the same as that of the first exemplary embodiment except that materials of a part of films is different.

A specific feature of the present exemplary embodiment resides in the fact that the GaN layer 24A is inserted between the sub-collector layer 13 of the n-type GaN layer and the inclined composition AlGaN layer 24B. The thickness of the GaN layer 24A can be arbitrarily determined without restriction of a critical thickness. Therefore, the thickness of the collector layer 24 can be increased. Thus, the collector breakdown voltage can be improved.

Figure 7:
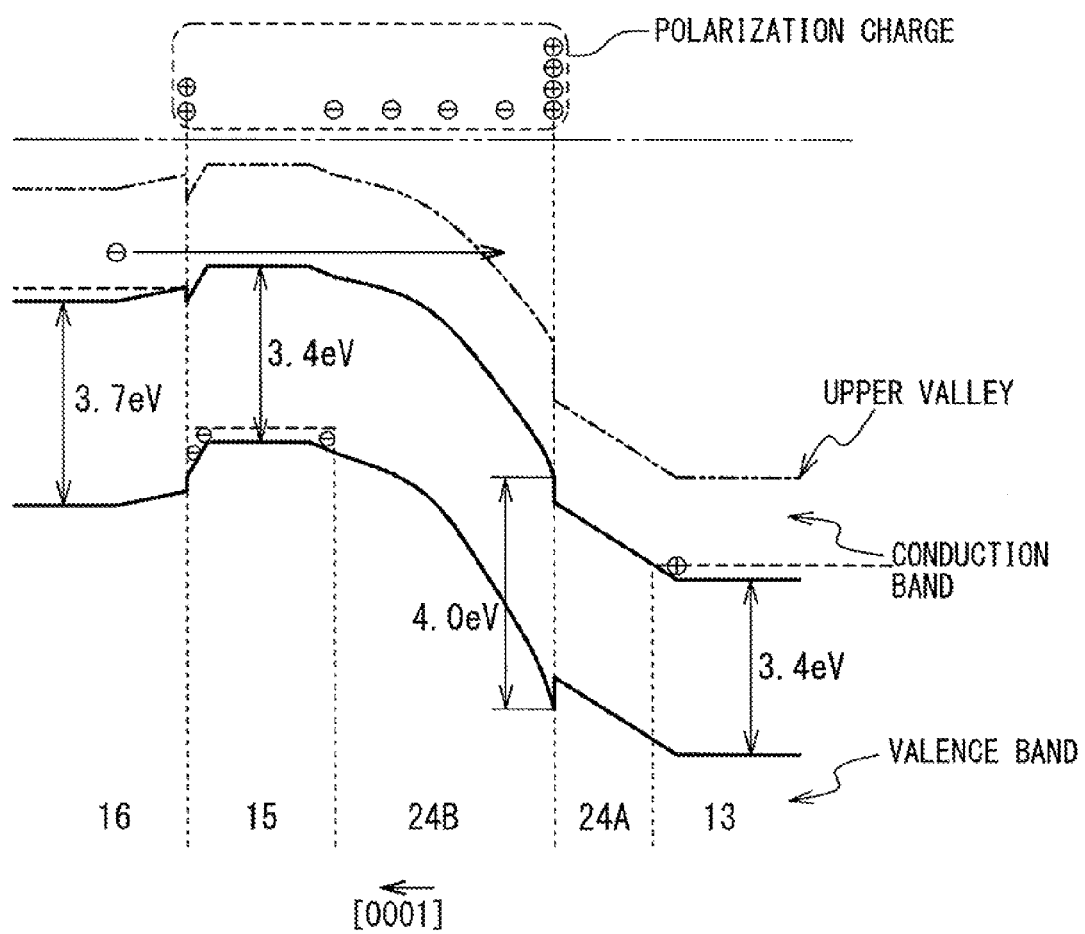
FIG. 7 is a diagram showing an example of an energy band of the bipolar transistor according to the second exemplary embodiment of the present invention.

An energy band of such a bipolar transistor is described. FIG. 7 shows an example of an energy band diagram of the bipolar transistor according to the second exemplary embodiment of the present invention. This energy band diagram shows the case where a forward bias is applied between the base and the emitter (i.e., between the base layer 15 and the emitter layer 16) and a reverse bias is applied between the base and the collector (i.e., between the base layer 15 and the collector layer 24) under the condition of xe=0.1, xc1=0.2 and xc2=0 in the bipolar transistor shown in FIG. 6.

The electric field intensity within the GaN layer 29A is uniform. Whereas, negative electric charges are generated within the inclined composition AlGaN layer 24B. Therefore, an internal electric field having a convex potential protruded upward with respect to electrons is generated. Thus, the electric field concentration at the interface between the base and the collector (i.e., between the base layer 15 and the collector layer 24) is released. Simultaneously, since a position at which the electric field intensity is maximum is shifted to a side of the sub-collector layer 13, it becomes difficult for electrons injected into the inclined composition AlGaN layer 24B of the collector layer 24 from the base layer 15 to be high energy. Thus, valley scatterings are suppressed to thereby increase a carrier speed so that a cut-off frequency is improved.

Further, a band gap of the inclined composition AlGaN layer 24B becomes larger toward the sub-collector 13 (GaN layer). The position at which the electric field intensity is maximum is also shifted to a side of the sub-collector layer 13. Therefore, the band gap in the position at which the electric field is maximum becomes large so that an avalanche breakdown is suppressed from occurring. Thus, the collector breakdown voltage can be also improved.

(Third Exemplary Embodiment)

Figure 8:
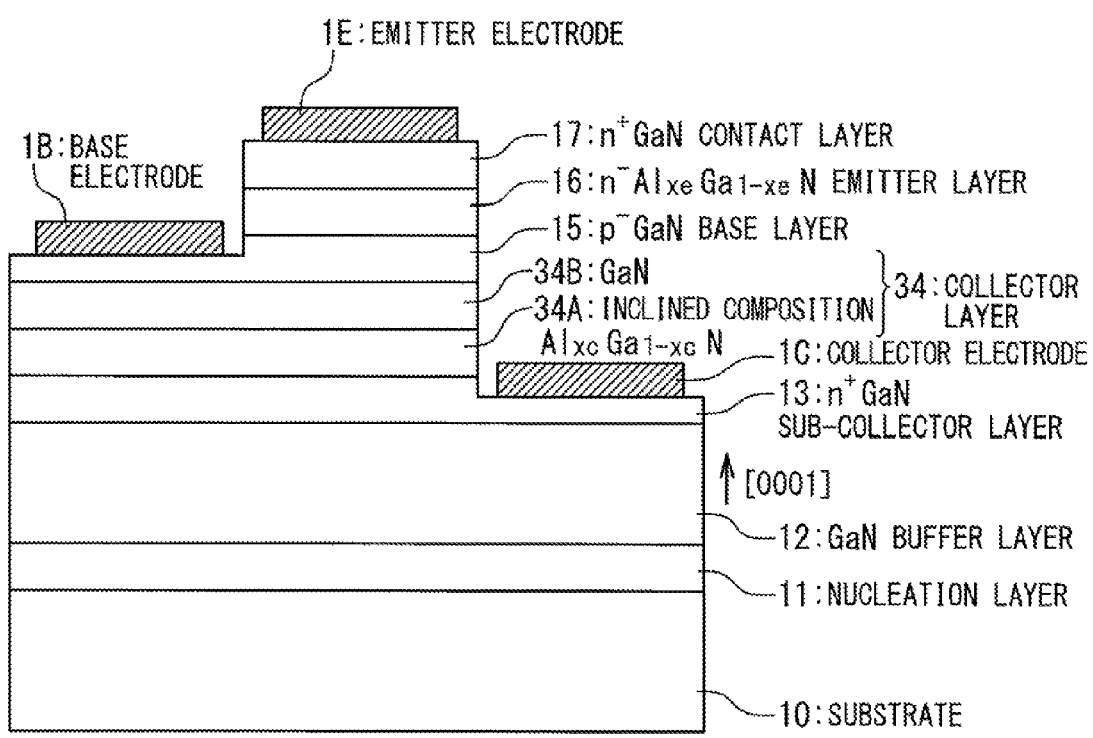
FIG. 8 is a sectional view showing a configuration of a bipolar transistor according to a third exemplary embodiment of the present invention.

A configuration of a bipolar transistor according to a third exemplary embodiment of the present invention is described. FIG. 8 is a sectional view showing a configuration of the bipolar transistor according to the third exemplary embodiment of the present invention. In the first exemplary embodiment, the thickness of the collector layer 14 (AlGaN layer) is restricted to a critical thickness of dislocation generation. Therefore, the collector layer 14 cannot be fully thick and a collector breakdown voltage is restricted. In the third exemplary embodiment, such a restriction of the collector breakdown voltage can be removed.

As shown in FIG. 8, the bipolar transistor includes the substrate 10, the nucleation layer 11, the buffer layer 12, the sub-collector layer 13, a collector layer 34, the base layer 15, the emitter layer 16, the contact layer 17, the emitter electrode 1E, the base electrode 1B and the collector electrode 1C.

In the present exemplary embodiment, the collector layer 14 in the bipolar transistor in the first exemplary embodiment is replaced with the collector layer 34. The collector layer 34 has a two-layer structure of an undoped inclined composition $Al_{xc}Ga_{1-xc}N$ layer 34A and an undoped GaN layer 34B that are laminated in this order.

The Al composition xc of the inclined composition $Al_{xc}Ga_{1-xc}N$ layer 34A is gradually reduced from xc1 to xc2 toward the GaN layer 34B from the sub-collector layer 13 (n-type GaN layer). Here, $0 \leq xc2 < xc1 < 1$ is established. The state of this inclined composition $Al_{xc}Ga_{1-xc}N$ layer 34A is exemplified as a state of, for example, the collector layer 14 (AlGaN layer) in FIG. 4C. For example, a thickness of the inclined composition $Al_{xc}Ga_{1-xc}N$ layer 34A is 500 nm and a thickness of the GaN layer 34B is 500 nm under the condition of xc1=0.2 and xc2=0. Here, the thickness of the inclined composition AlGaN layer 34A is the critical thickness of the dislocation generation or less. The manufacturing method of the present bipolar transistor is the same as that of the first exemplary embodiment except that materials of a part of films is different.

A specific feature of the present exemplary embodiment resides in the fact that the GaN layer 34B is inserted between the inclined composition AlGaN layer 34A and the base layer 15 of the p-type GaN layer. The thickness of the GaN layer 34B can be arbitrarily determined without restriction of a critical thickness. Therefore, the thickness of the collector layer 34 can be increased. Thus, the collector breakdown voltage can be improved.

Figure 9:
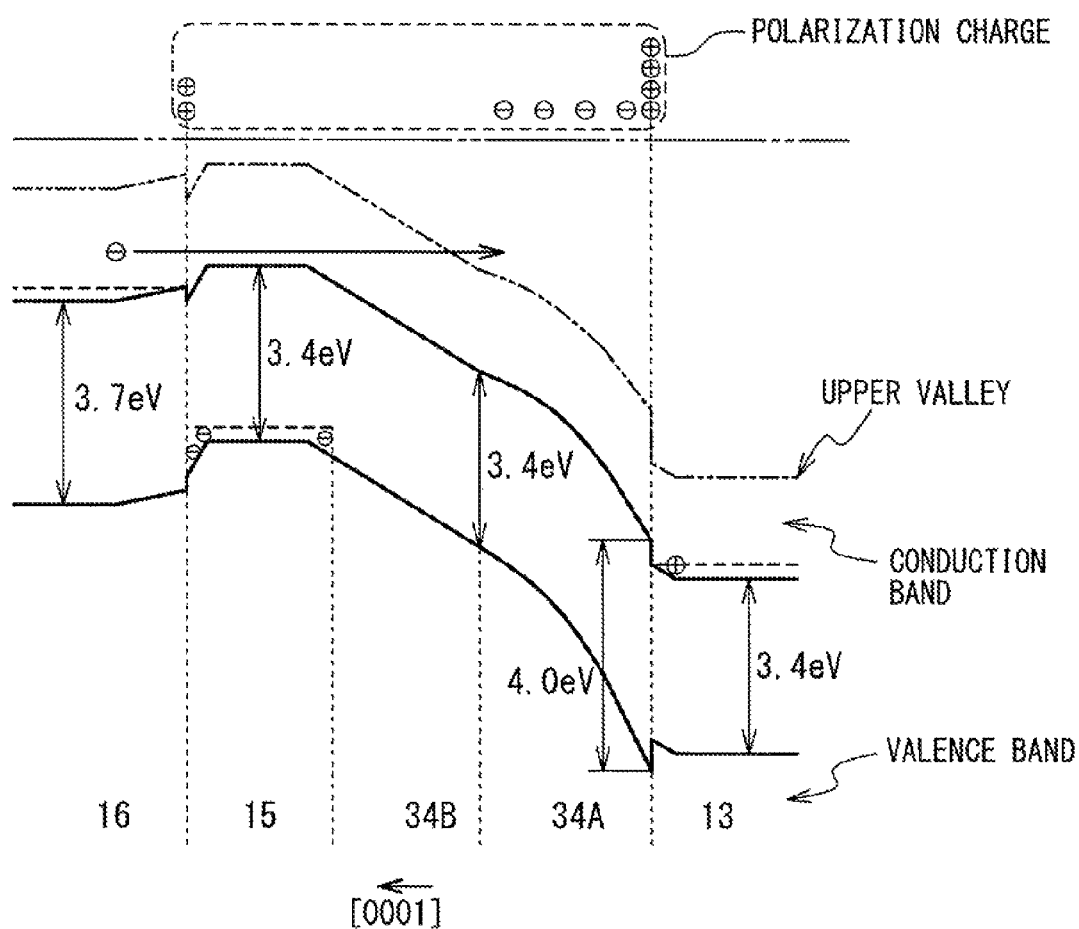
FIG. 9 is a diagram showing an example of an energy band of the bipolar transistor according to the third exemplary embodiment of the present invention.

An energy band of such a bipolar transistor is described. FIG. 9 shows an example of an energy band diagram of the bipolar transistor according to the third exemplary embodiment of the present invention. This energy band diagram shows the case where a forward bias is applied between the base and the emitter (i.e., between the base layer 15 and the emitter layer 16) and a reverse bias is applied between the base and the collector (i.e., between the base layer 15 and the collector layer 34) under the condition of xe=0.1, xc1=0.2 and xc2=0 in the bipolar transistor shown in FIG. 8.

The electric field intensity within the GaN layer 34B is uniform. Whereas, negative electric charges are generated within the inclined composition AlGaN layer 34A. Therefore, an internal electric field having a convex potential protruded upward with respect to electrons is generated. Thus, the electric field concentration at the interface between the base and the collector (i.e., between the base layer 15 and the collector layer 34) is released. Simultaneously, since the position at which electric field intensity is maximum is shifted to a side of the sub-collector layer 13, it becomes difficult for the electrons injected into the GaN layer 34B of the collector layer 34 from the base layer 15 to be high energy. Thus, valley scatterings are suppressed to thereby increase a carrier speed so that a cut-off frequency is improved.

Further, a band gap of the inclined composition AlGaN layer 34A becomes larger toward the sub-collector 13 (GaN layer). The position at which the electric field intensity is maximum is also shifted to a side of the sub-collector layer 13. Therefore, the band gap in a position at which the electric field is maximum becomes large so that an avalanche breakdown is suppressed from occurring. Thus, a collector breakdown voltage can be also improved.

(Fourth Exemplary Embodiment)

Figure 10:
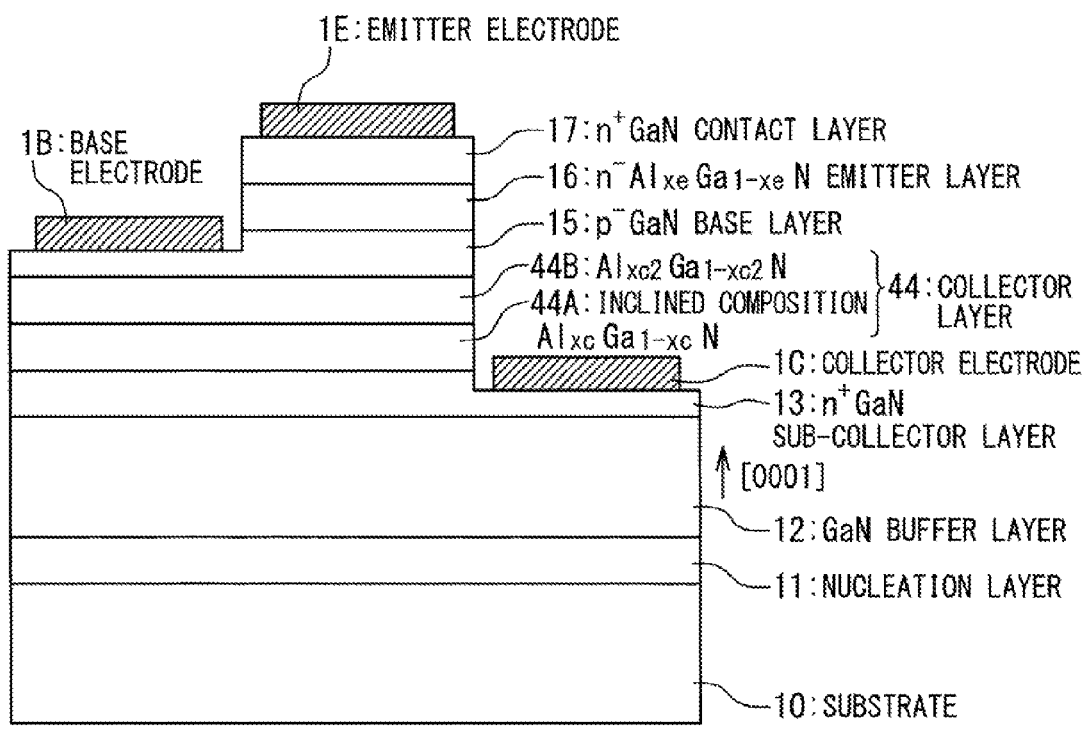
FIG. 10 is a sectional view showing a configuration of a bipolar transistor according to a fourth exemplary embodiment of the present invention.

A configuration of a bipolar transistor according to a fourth exemplary embodiment of the present invention is described. FIG. 10 is a sectional view showing a configuration of the bipolar transistor according to the fourth exemplary embodiment of the present invention. In the above-mentioned exemplary embodiment, a material of the base side and a material of the collector side at the interface between the base and the collector (i.e., between the base layer and the collector layer) include the same GaN. Therefore, it is possibly considered that the so-called Kirk effect arises in which by positive holes in the base layer being diffused into the collector layer (AlGaN), a base length is substantially extended, thereby lowering a switching speed. In the fourth exemplary embodiment, the Kirk effect can be surely prevented from occurring.

As shown in FIG. 10, the bipolar transistor includes the substrate 10, the nucleation layer 11, the buffer layer 12, the sub-collector layer 13, a collector layer 44, the base layer 15, the emitter layer 16, the contact layer 17, the emitter electrode 1E, the base electrode 1B and the collector electrode 1C.

In the present exemplary embodiment, the collector layer 14 in the bipolar transistor in the first exemplary embodiment is replaced with the collector layer 44. The collector layer 44 has a two-layer structure of an undoped inclined composition $Al_{xc}Ga_{1-xc}N$ layer 44A and an undoped $Al_{xc2}Ga_{1-xc2}N$ layer 44B that are laminated in this order.

The Al composition xc of the inclined composition $Al_{xc}Ga_{1-xc}N$ layer 44A is gradually reduced from xc1 to xc2 toward the AlGaN layer 44B from the sub-collector layer (n-type GaN layer). Herein, $0 \leq xc2 < xc1 \leq 1$ is established. The state of this inclined composition $Al_{xc}Ga_{1-xc}N$ layer 44A is exemplified as a state of, for example, the collector layer 14 (AlGaN layer) in FIG. 4C. For example, a thickness of the inclined composition $Al_{xc}Ga_{1-xc}N$ layer 44A is 250 nm and a thickness of the $Al_{xc2}Ga_{1-xc2}N$ layer 44B is 500 nm under the condition of xc1=0.2 and xc2=0.1. Here, each of the thicknesses of the inclined composition $Al_{xc}Ga_{1-xc}N$ layer 44A and the $Al_{xc2}Ga_{1-xc2}N$ layer 44B is the critical thickness of the dislocation generation or less. The manufacturing method of the present bipolar transistor is the same as that of the first exemplary embodiment except that materials of a part of films is different.

A specific feature of the present exemplary embodiment resides in the fact that an intermediate composition AlGaN layer 44B is inserted between the inclined composition AlGaN layer 44A and the base layer 15 of a p-type GaN layer. A band gap of the AlGaN layer 44B is larger than that of the base layer 15 (p-type GaN layer). Therefore, a valence band offset acts as a potential barrier to the positive holes. Thus, the positive holes in the base layer 15 are suppressed from diffusing into the AlGaN layer 44B of the collector layer 44 so as to prevent the Kirk effect from occurring.

Figure 11:
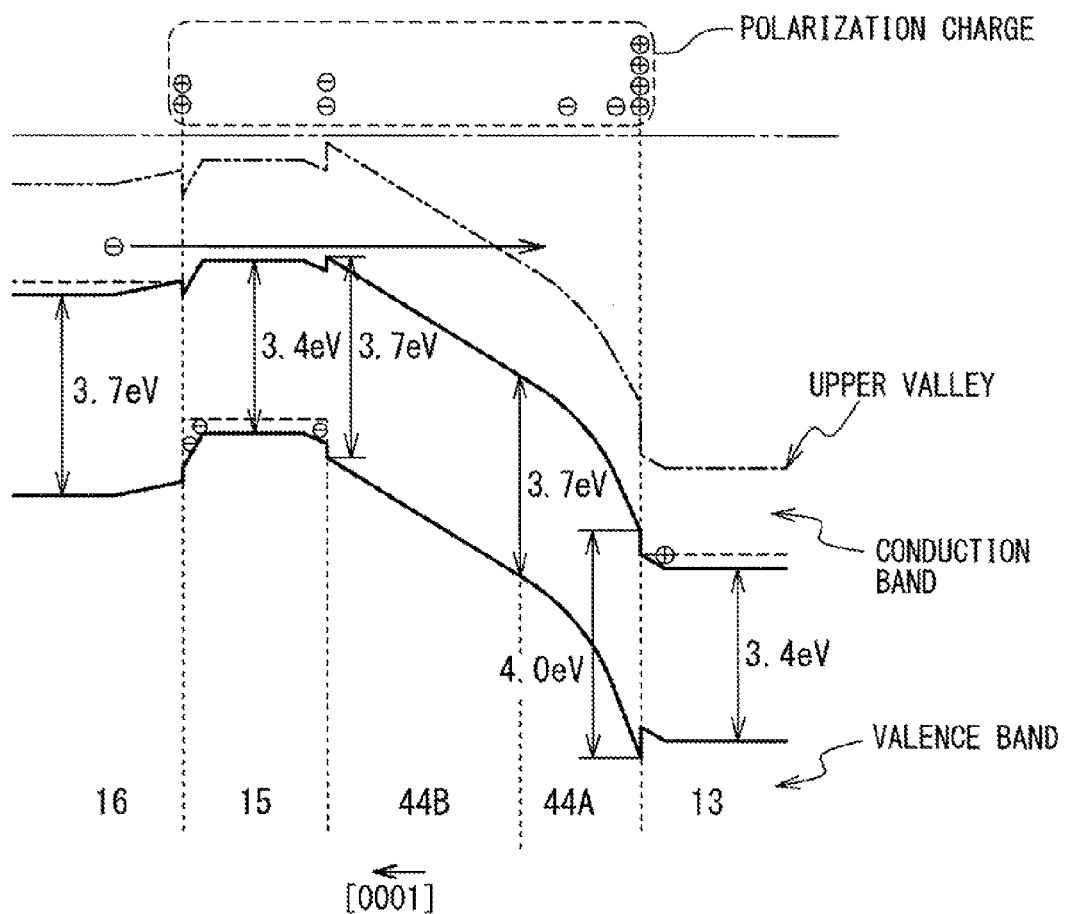
FIG. 11 is a diagram showing an example of an energy band of the bipolar transistor according to the fourth exemplary embodiment of the present invention.

An energy band of such a bipolar transistor is described. FIG. 11 shows an example of an energy band diagram of the bipolar transistor according to the fourth exemplary embodiment of the present invention. This s energy band diagram shows the case where a forward bias is applied between the base and the emitter (i.e., between the base layer 15 and the emitter layer 16) and a reverse bias is applied between the base and the collector (i.e., between the base layer 15 and the collector layer 44) under the condition of xe=0.1, xc1=0.2 and xc2=0.1 in the bipolar transistor shown in FIG. 10.

The electric field intensity within the $Al_{xc2}Ga_{1-xc2}N$ layer 44B is uniform. Whereas, negative electric charges are generated within the inclined composition $Al_{xc}Ga_{1-xc}N$ layer 44A. Therefore, an internal electric field having a convex potential protruded upward with respect to electrons is generated. Thus, the electric field concentration at the interface between the base and the collector (i.e., between the base layer 15 and the collector layer 44) is released. Simultaneously, since a position at which the electric field intensity is maximum is shifted to a side of the sub-collector layer 13, it becomes difficult for electrons injected into the $Al_{xc2}Ga_{1-xc2}N$ layer 44B of the collector layer 44 from the base layer 15 to be high energy. Thus, valley scatterings are suppressed to thereby increase a carrier speed so that a cut-off frequency is improved.

Further, a band gap of the AlGaN layer 44A becomes larger toward the sub-collector 13 (GaN layer). The position at which the electric field intensity is maximum is also shifted to a side of the sub-collector layer 13. Therefore, the band gap in the position at which the electric field is maximum becomes large so that an avalanche breakdown is suppressed from occurring. Thus, the collector breakdown voltage can be also improved.

(Fifth Exemplary Embodiment)

Figure 12:
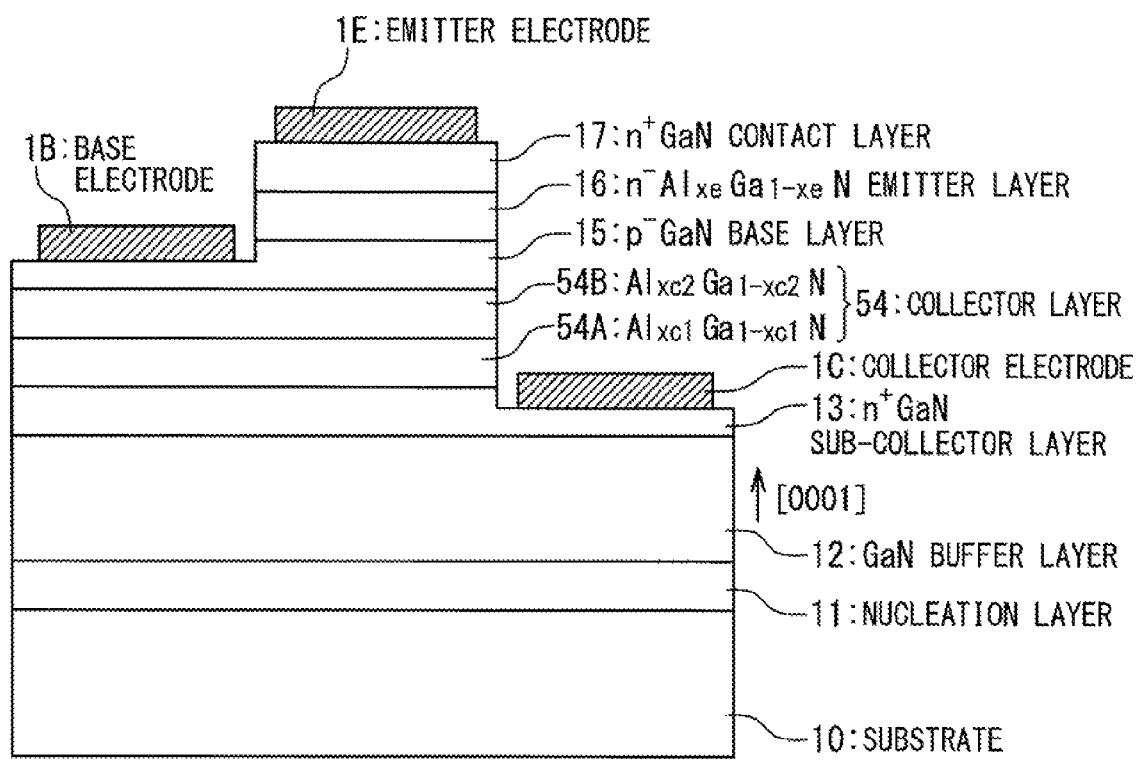
FIG. 12 is a sectional view showing a configuration of a bipolar transistor according to a fifth exemplary embodiment of the present invention.

A configuration of a bipolar transistor according to a fifth exemplary embodiment of the present invention is described. FIG. 12 is a sectional view showing a configuration of the bipolar transistor according to the fifth exemplary embodiment of the present invention. In the above-mentioned exemplary embodiment, there is used an inclined composition AlGaN layer with an Al composition gradually varied as a collector layer. In order to form such an epitaxial crystal layer, it is necessary to vary flow rates of raw material gases with time lapse and there exists difficulties in controllability of the crystal composition. Therefore, it is not easy to maintain a high reproducibility and uniformity of element characteristics. In the fifth exemplary embodiment, the reproducibility and uniformity of the element characteristics can be highly maintained.

As shown in FIG. 12, the bipolar transistor includes the substrate 10, the nucleation layer 11, the buffer layer 12, the sub-collector layer 13, a collector layer 54, the base layer 15, the emitter layer 16, the contact layer 17, the emitter electrode 1E, the base electrode 1B and the collector electrode 1C.

In the present exemplary embodiment, the collector layer 14 in the bipolar transistor in the first exemplary embodiment is replaced with the collector layer 54. The collector layer 54 has a two-layer structure of a uniform composition undoped $Al_{xc1}Ga_{1-xc1}N$ layer 54A and a uniform composition undoped $Al_{xc2}Ga_{1-xc2}N$ layer 54B that are laminated in this order.

It is assumed that the Al composition xc1 of the $Al_{xc1}Ga_{1-xc1}N$ layer 54A is larger than the Al composition xc2 of the $Al_{xc2}Ga_{1-xc2}N$ layer 54B. Herein, $0 \leq xc2 < xc1 \leq 1$ is established. For example, under the condition of xc1=0.2 and xc2=0.1, a thickness of the $Al_{0.2}Ga_{0.8}N$ layer 54A is 100 nm and a thickness of the $Al_{0.1}Ga_{0.9}N$ layer 54B is 500 nm. Here, each of the thicknesses of the AlGaN layer 54A and the AlGaN layer 54B is the critical thickness of the dislocation generation or less. The manufacturing method of the present bipolar transistor is the same as that of the first exemplary embodiment except that materials of a part of films is different.

A specific feature of the present exemplary embodiment resides in the fact that the collector layer 55 is formed of step-wise composition AlGaN layer including a high Al composition AlGaN layer 54A and a low Al composition AlGaN layer 54B. Since the epitaxial growth is facilitated, controllability of the crystal composition is improved so that the reproducibility and uniformity of element characteristics can be improved.

Figure 13:
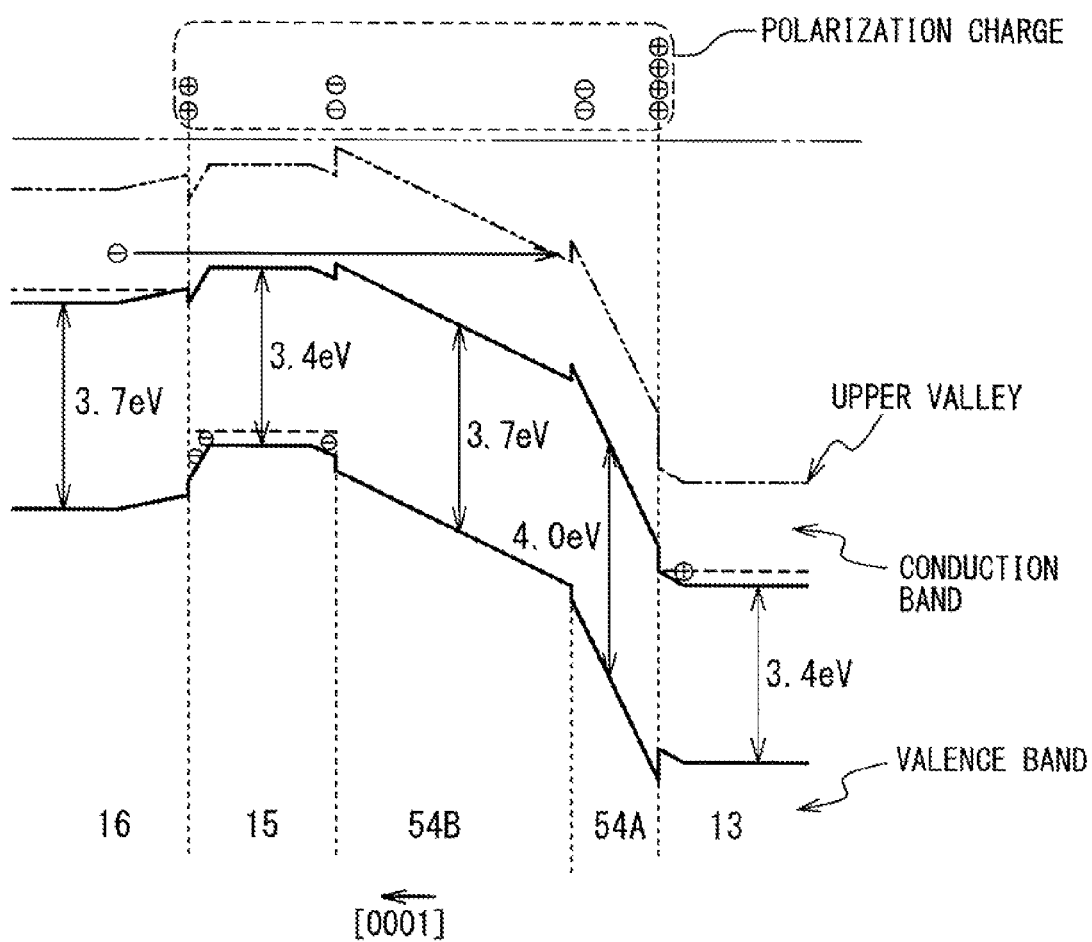
FIG. 13 is a diagram showing an example of an energy band of the bipolar transistor according to the fifth exemplary embodiment of the present invention.

An energy band of such a bipolar transistor is described. FIG. 13 shows an example of an energy band diagram of the bipolar transistor according to the fifth exemplary embodiment of the present invention. This energy band diagram shows the case where a forward bias is applied between the base and the emitter (i.e., between the base layer 15 and the emitter layer 16) and a reverse bias is applied between the base and the collector (i.e., between the base layer 15 and the collector layer 54) under the condition of xe=0.1, xc1=0.2 and xc2=0.1 in the bipolar transistor shown in FIG. 12.

Since negative electric charges are generated at an interface between the AlGaN layer 54A and the AlGaN layer 54B, the electric field becomes discontinuous and the position at which the electric field intensity is maximum is within the AlGaN layer 54A. Therefore, it becomes difficult for electrons injected into the AlGaN layer 54B of the collector layer 54 from the base layer 15 to be high energy. Thus, valley scatterings are suppressed to thereby increase a carrier speed so that a cut-off frequency is improved.

Further, a band gap of the AlGaN layer 54A becomes larger than that of the AlGaN layer 54B. Also, the electric field intensity becomes maximum at the AlGaN layer 54A. Therefore, the band gap in a position at which the electric field is maximum becomes large so that an avalanche breakdown is suppressed from occurring. Thus, the collector breakdown voltage can be also improved.

Moreover, the band gap of the AlGaN layer 54B is larger than that of the base layer 15. Therefore, a valence band offset acts as a potential barrier to positive holes. Thus, the positive holes in the base layer 15 are suppressed from diffusing into the AlGaN layer 54B of the collector layer 54 so as to improve the Kirk effect.

(Sixth Exemplary Embodiment)

Figure 14:
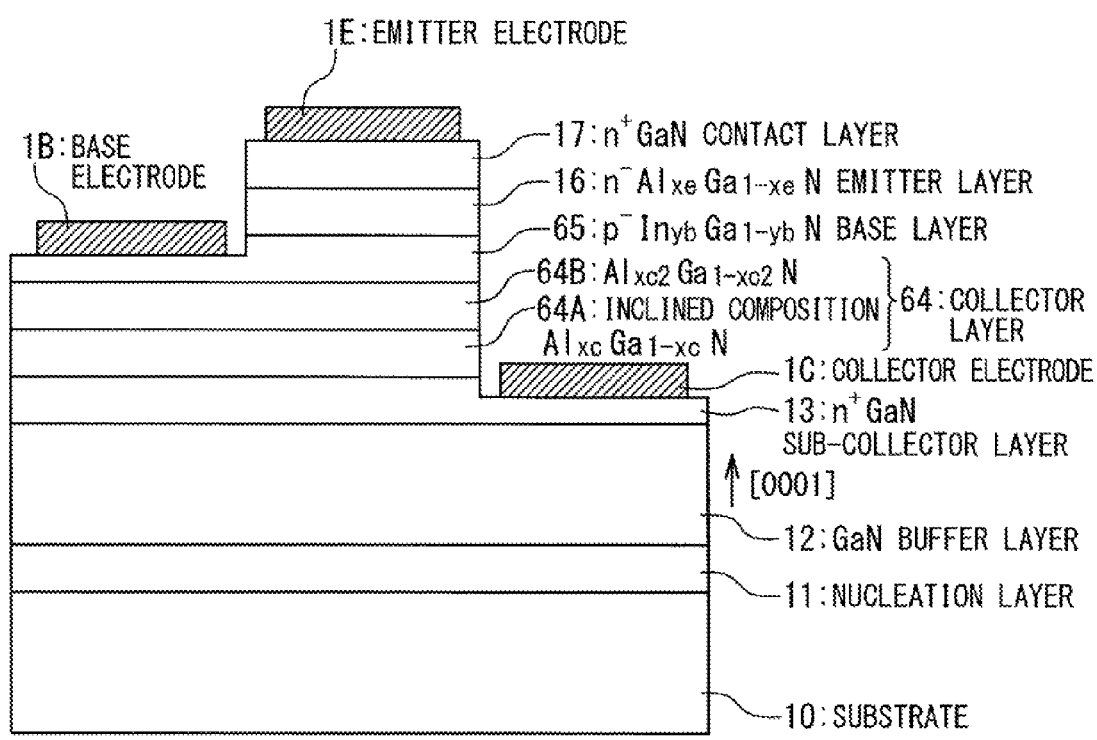
FIG. 14 is a sectional view showing a configuration of a bipolar transistor according to a sixth exemplary embodiment of the present invention.

A configuration of a bipolar transistor according to a sixth exemplary embodiment of the present invention is described. FIG. 14 is a sectional view showing a configuration of the bipolar transistor according to the sixth exemplary embodiment of the present invention. For example, in the first to third exemplary embodiments, a material of the base side and a material of the collector side at the interface between the base and the collector (i.e., between the base layer and the collector layer) include the same GaN. Therefore, it is possibly considered that the so-called Kirk effect arises in which by positive holes in the base layer being diffused into the collector layer 34, abase length is substantially extended, thereby lowering a switching speed. In the sixth exemplary embodiment, the Kirk effect can be surely prevented from occurring.

As shown in FIG. 14, the bipolar transistor includes the substrate 10, the nucleation layer 11, the buffer layer 12, the sub-collector layer 13, a collector layer 64, a base layer 65, the emitter layer 16, the contact layer 17, the emitter electrode 1E, the base electrode 1B and the collector electrode 1C.

In the present exemplary embodiment, the collector layer 14 and the base layer 15 in the bipolar transistor in the first exemplary embodiment are replaced with the collector layer 64 and the base layer 65, respectively.

The collector layer 64 has a two-layer structure of an undoped inclined composition $Al_{xc}Ga_{1-xc}N$ layer 64A and an undoped $Al_{xc2}Ga_{1-xc2}N$ layer 64B that are laminated in this order. Further, the base layer 65 includes a p-type $In_{yb}Ga_{1-yb}N$ layer.

The Al composition xc of the inclined composition $Al_{xc}Ga_{1-xc}N$ layer 64A is gradually reduced from xc1 to xc2 toward the AlGaN layer 64B from the sub-collector layer 13 (n-type GaN layer). Here, $0 \leq xc2 < xc1 \leq 1$ is established. The state of this inclined composition $Al_{xc}Ga_{1-xc}N$ layer 64A is exemplified as a state of, for example, the collector layer 14 (AlGaN layer) in FIG. 4C. For example, a thickness of the inclined composition $Al_{xc}Ga_{1-xc}N$ layer 64A is 500 nm and a thickness of the $Al_{xc2}Ga_{1-xc2}N$ layer 64B (GaN layer) is 500 nm under the condition of xc1=0.2 and xc2=0. Here, the thickness of the inclined composition AlGaN layer 64A is the critical thickness of the dislocation generation or less.

The In composition yb of the base layer 65 of the p-type $In_{yb}Ga_{1-yb}N$ layer is assumed to be $0 \leq yb \leq 1$. From the viewpoint of suppressing a dislocation generation and obtaining a good crystal quality, it is preferable to be $0 \leq yb \leq 0.1$. In case of the present exemplary embodiment, if the thickness of the InGaN layer 65 is 100 nm under the condition of yb=0.05, the thickness is within the critical thickness of dislocation generation. The manufacturing method of the present bipolar transistor is the same as that of the first exemplary embodiment except that materials of a part of films is different.

A specific feature of the present exemplary embodiment resides in the fact that the base layer 65 is formed of the InGaN layer having a band gap smaller than that of the GaN layer and that the collector layer 64 is formed of the inclined composition AlGaN layer 64A and the AlGaN layer 64B. Specifically, the band gap of the GaN layer 64B in the case of xc2=0 is larger than that of the InGaN layer of the base layer 65. Therefore, a valence band offset acts as a potential barrier to positive holes. Thus, the positive holes in the base layer 65 are suppressed from diffusing into the GaN layer 64B of the collector layer 64 so as to improve the Kirk effect.

Figure 15:
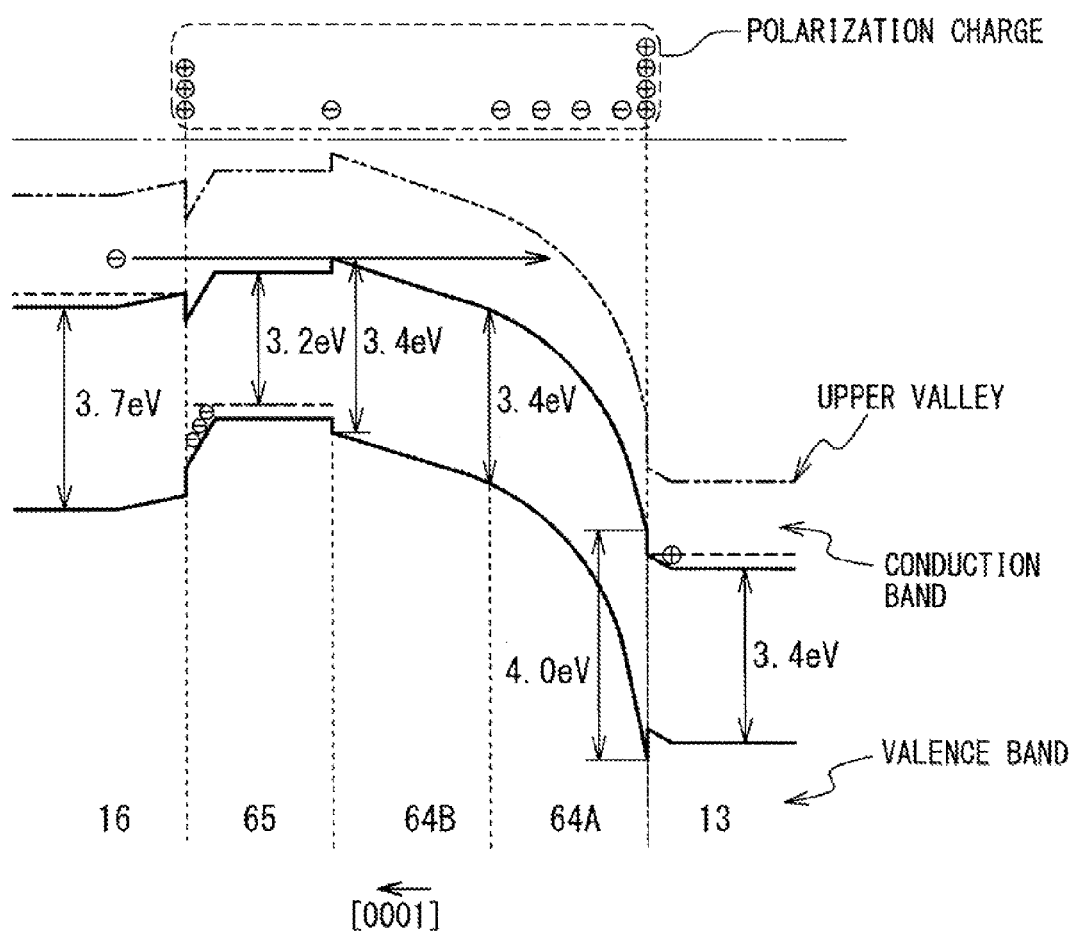
FIG. 15 is a diagram showing an example of an energy band of the bipolar transistor according to the sixth exemplary embodiment of the present invention.

An energy band of such a bipolar transistor is described. FIG. 15 shows an example of an energy band diagram of the bipolar transistor according to the sixth exemplary embodiment of the present invention. This s energy band diagram shows the case where a forward bias is applied between the base and the emitter (i.e., between the base layer 65 and the emitter layer 16) and a reverse bias is applied between the base and the collector (i.e., between the base layer 65 and the collector layer 64) under the condition of xe=0.1, yb=0.05, xc1=0.2 and xc2=0 in the bipolar transistor shown in FIG. 14.

The electric field intensity within the GaN layer 64B is uniform. Whereas, negative electric charges are generated within the inclined composition $Al_{xc}Ga_{1-xc}N$ layer 64A. Therefore, an internal electric field having a convex potential protruded upward with respect to electrons is generated. Thus, the electric field concentration at the interface between the base and the collector (i.e., between the base layer 65 and the collector layer 64) is released. Simultaneously, since a position at which the electric field intensity is maximum is shifted to a side of the sub-collector layer 13, it becomes difficult for electrons injected into the GaN layer 64B of the collector layer 64 from the base layer 65 to be high energy. Thus, valley scatterings are suppressed to thereby increase a carrier speed so that a cut-off frequency is improved.

Further, a band gap of the AlGaN layer 64A becomes larger toward the sub-collector 13 (GaN layer). The position at which the electric field intensity is maximum is also shifted to a side of the sub-collector layer 13. Therefore, the band gap in the position at which the electric field is maximum becomes large so that an avalanche breakdown is suppressed from occurring. Thus, the collector breakdown voltage can be also improved.

(Seventh Exemplary Embodiment)

Figure 16:
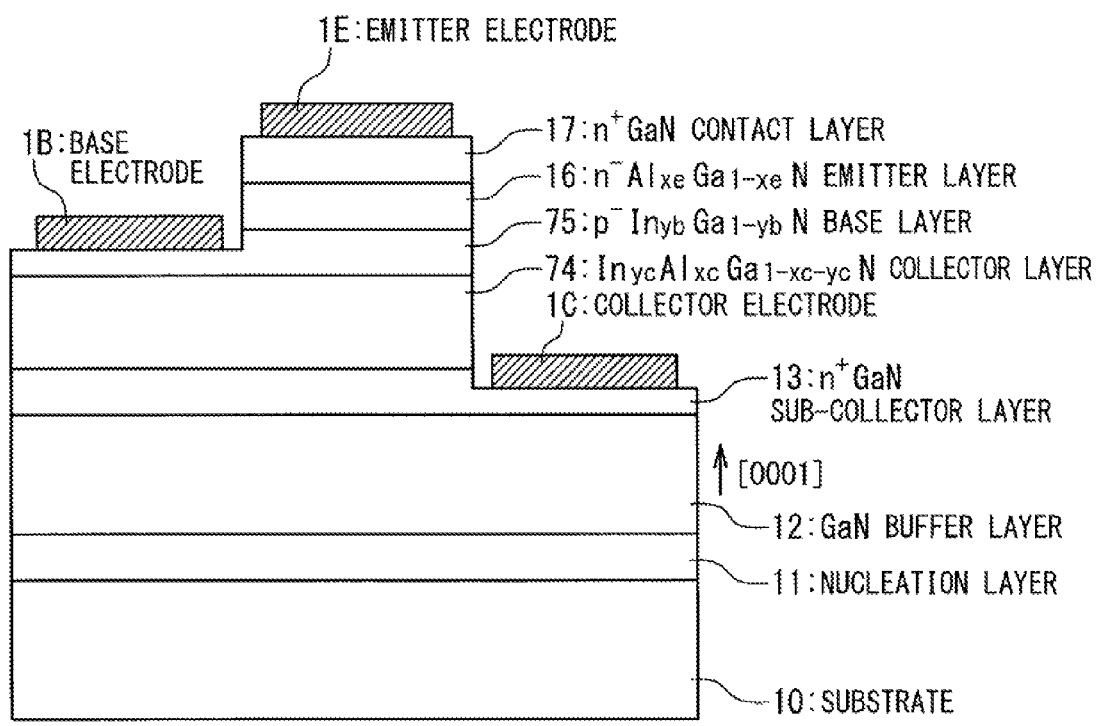
FIG. 16 is a sectional view showing a configuration of a bipolar transistor according to a seventh exemplary embodiment of the present invention.

A configuration of a bipolar transistor according to a seventh exemplary embodiment of the present invention is described. FIG. 16 is a sectional view showing a configuration of the bipolar transistor according to the seventh exemplary embodiment of the present invention. In the above-mentioned exemplary embodiment, an Al composition ratio of the AlGaN layer in the collector layer is reduced toward the base layer from the sub-collector layer in the (0001) plane growth. At that time, since an a-axis length of AlGaN is increased together with reduction of the Al composition, negative electric charges are generated within the AlGaN layer. Similarly, an a-axis length of the InAlGaN layer is increased together with increase of the In composition.

Therefore, there can be obtained a similar effect even in the case where the collector layer includes the InAlGaN layer so that the In composition is increased toward the base layer from the sub-collector layer. Alternatively, it may be also possible that the collector layer includes the InAlGaN layer so that the Al composition is reduced toward the base layer from the sub-collector layer. Thus, in the seventh exemplary embodiment, the collector layer includes the InAlGaN layer.

As shown in FIG. 16, the bipolar transistor includes the substrate 10, the nucleation layer 11, the buffer layer 12, the sub-collector layer 13, a collector layer 74, a base layer 75, the emitter layer 16, the contact layer 17, the emitter electrode 1E, the base electrode 1B and the collector electrode 1C.

In the present exemplary embodiment, the collector layer 14 and the base layer 15 in the bipolar transistor in the first exemplary embodiment are replaced with the collector layer 74 and the base layer 75, respectively. The collector layer 74 includes an undoped $In_{yc}Al_{xc}Ga_{1-xc-yc}N$ layer and the base layer 75 includes a p-type $In_{yb}Ga_{1-yb}N$ layer.

The collector layer 74 (InAlGaN layer) has an inclined composition structure or a step-wise composition structure in which the Al composition xc or the In composition structure yc is modulated in a film-thickness direction. The Al composition is assumed to be xc=xc1 and the In composition is assumed to be yc=yc1 at an interface with respect to the sub-collector layer 13 (n-type GaN layer) in the collector layer 74, and the Al composition is assumed to be xc=xc2 and the In composition is assumed to be yc=yc2 at an interface with respect to the base layer 75 (p-type GaN layer). In this case, $0 \leq xc2 \leq xc1 \leq 1$ and $0 \leq yc1 \leq yc2 \leq 1$ are established. Then, the Al composition xc of the collector layer 74 (InAlGaN layer) is assumed to be reduced or constant toward the base layer 75 from the sub-collector layer 13. Also, the In composition yc is assumed to be increased or constant toward the base layer 75 from the sub-collector layer 13. The collector layer 74 is thinner than a critical thickness of dislocation generation and becomes a strained lattice layer.

Here, it is assumed that an average Al composition of the collector layer 74 (InAlGaN layer) is $<xc>$ and an average In composition thereof is $<yc>$. Then, a lattice matching condition in which the a-axis length of the InAlGaN layer is coincident with the a-axis length of the GaN is represented as follows:

$$<xc> = 4.6 <yc> \quad \text{(Expression 1)}.$$

Thus, in order to suppress the dislocation generation and obtain a good crystal quality, it is sufficient to satisfy Expression 2 as following:

$$|<xc> - 4.6 <yc>| < 0.5 \quad \text{(Expression 2)}.$$

The In composition yb of the base layer 75 (InGaN layer) is assumed to be $0 \leq yb \leq 1$. From the viewpoint of suppressing a dislocation generation and obtaining a good crystal quality, it is preferable to be $0 \leq yb \leq 0.1$. The manufacturing method of the present bipolar transistor is the same as that of the first exemplary embodiment except that materials of a part of films is different.

Figure 17A:
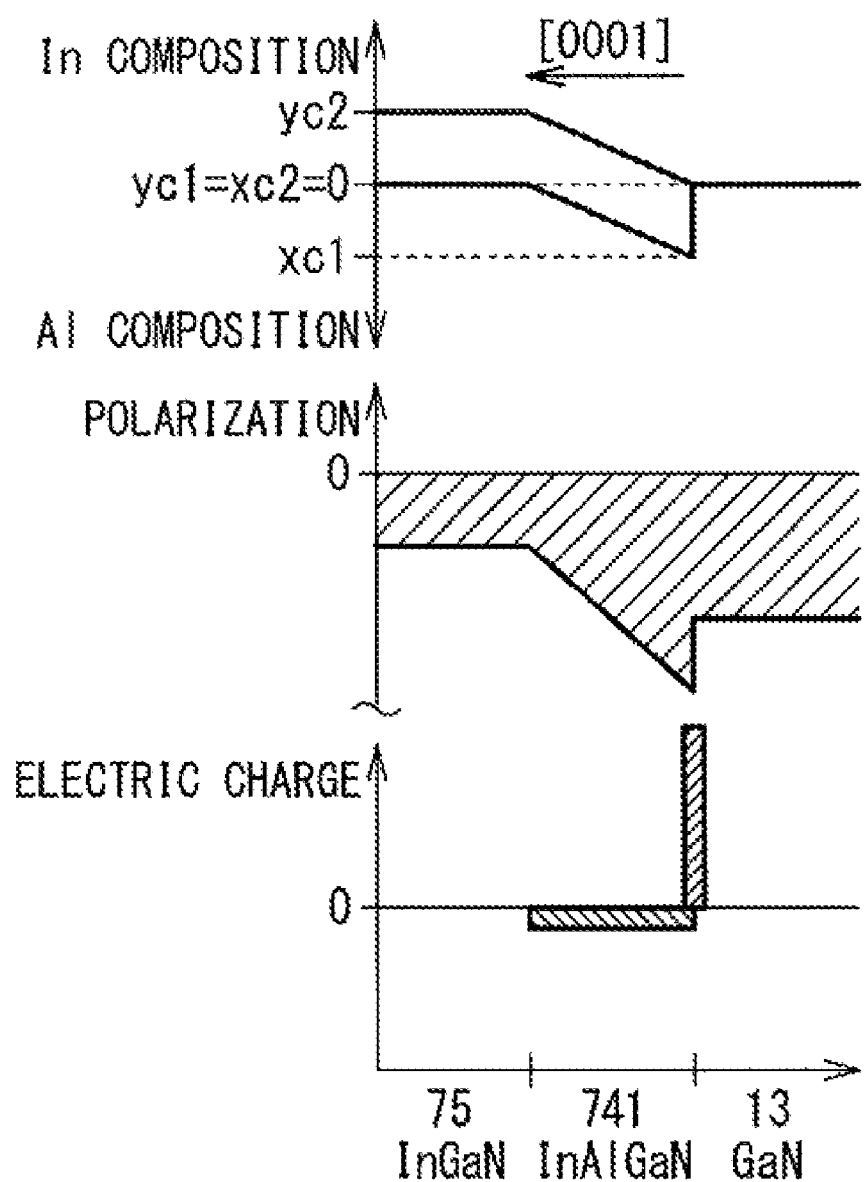
FIG. 17A is a graph showing a representative example of an (Al, In) composition distribution, a polarization amount distribution and an electric charge distribution in the bipolar transistor according to the seventh exemplary embodiment of the present invention.
Figure 17B:
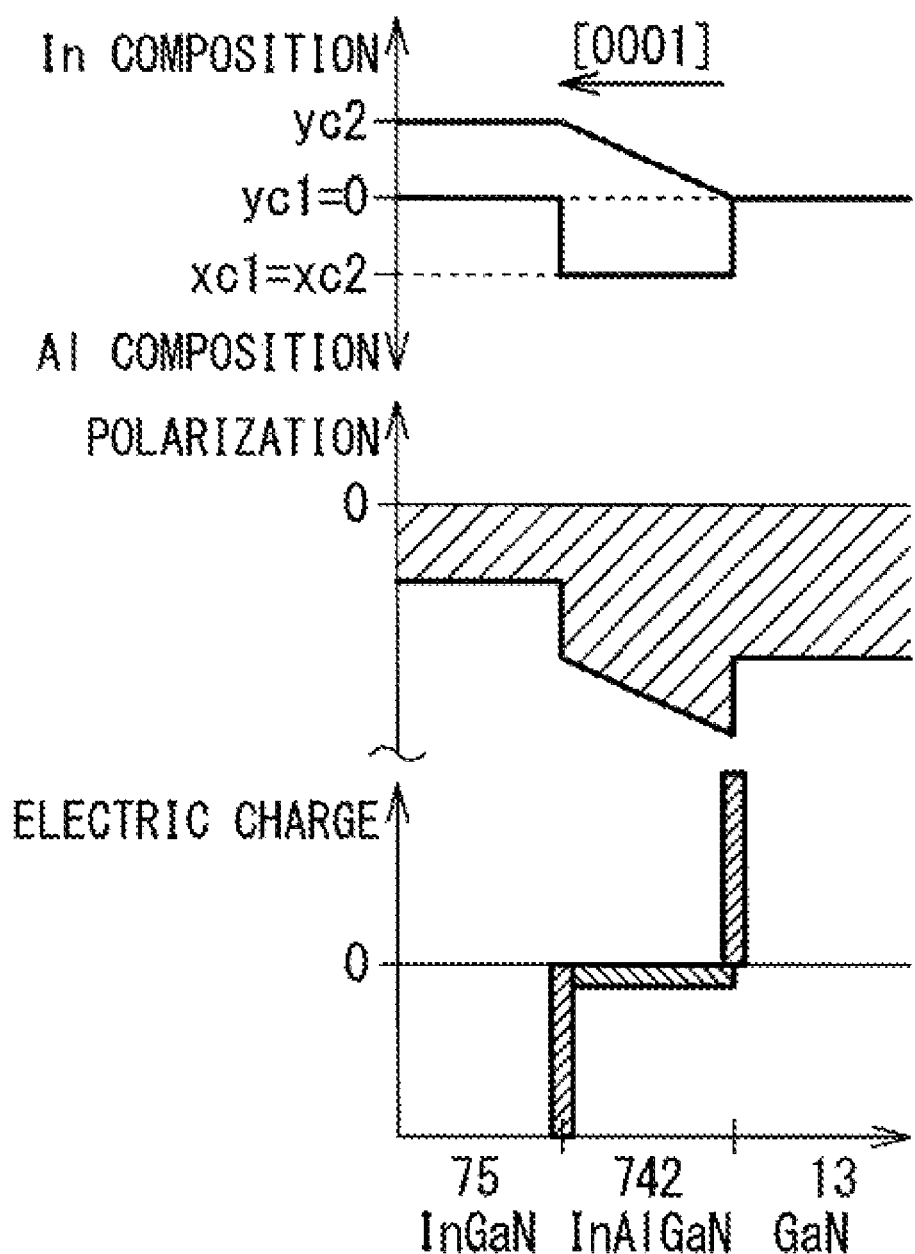
FIG. 17B is a graph showing a representative example of an (Al, In) composition distribution, a polarization amount distribution and an electric charge distribution in the bipolar transistor according to the seventh exemplary embodiment of the present invention.
Figure 17C:
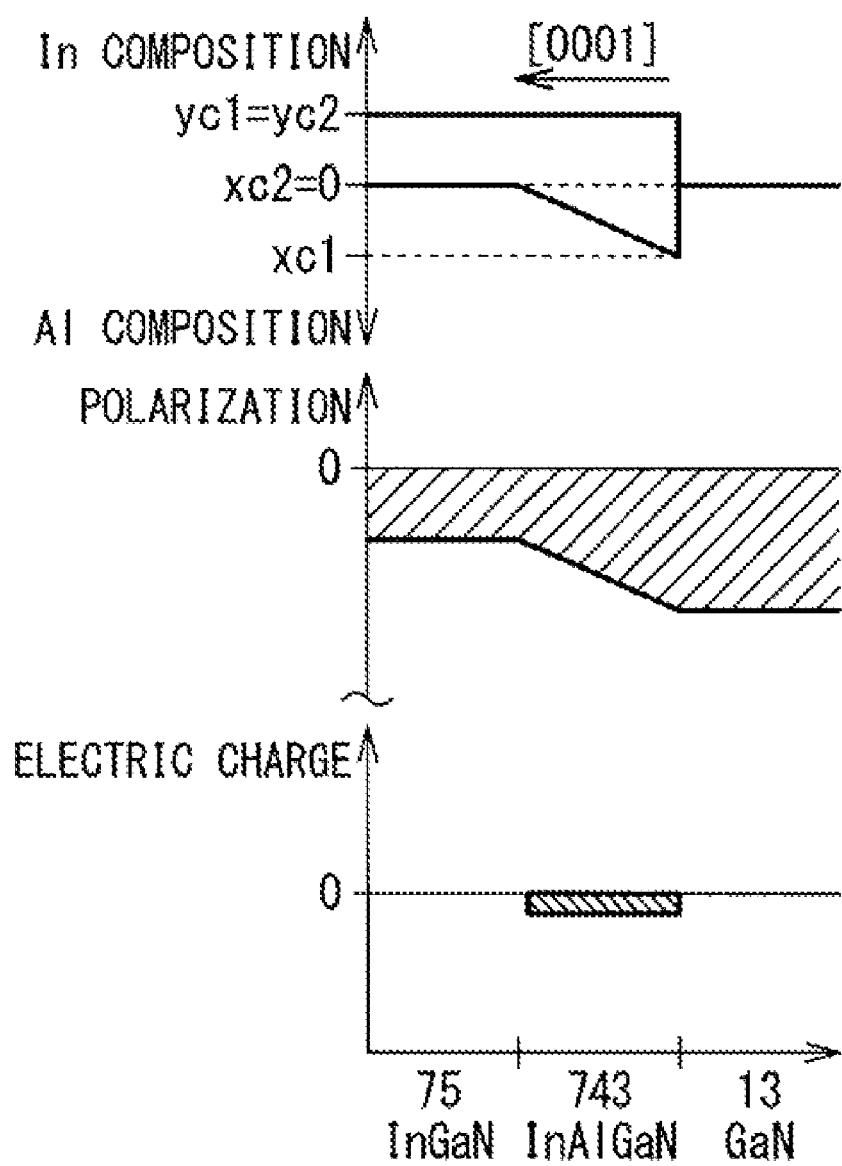
FIG. 17C is a graph showing a representative example of an (Al, In) composition distribution, a polarization amount distribution and an electric charge distribution in the bipolar transistor according to the seventh exemplary embodiment of the present invention.

FIGS. 17A to 17C are graphs each showing a representative example of an (Al, In) composition distribution, a polarization amount distribution and an electric charge distribution in the bipolar transistor according to the seventh exemplary embodiment of the present invention. However, in the figures, the crystal composition of the collector layer 74 (InAlGaN layer) is selected so that an a-axis length increases toward the base layer 75 from the sub-collector layer 13. Further, vertical axes respectively and separately indicate an In composition/ an Al composition, polarization and electric charge in the order from the top. Here, the Al composition in the downward direction is positive. A horizontal axis indicates positions (of the base layer 75 (InGaN layer), the collector layer 74 (InAlGaN layer) and the sub-collector layer 13 (GaN layer), respectively) in the bipolar transistor.

FIG. 17A shows the case where the collector layer 74 ($In_{yc}Al_{xc}Ga_{1-xc-yc}N$ layer) is formed of an InAlGaN layer 741 having an inclined composition satisfying $0 \leq xc2 < xc1 \leq 1$ and $0 \leq yc1 < yc2 \leq 1$. As shown in the upper graph, toward the base layer 75 from the sub-collector 13, the Al composition of the InAlGaN layer 741 is reduced and the In composition thereof is increased. Further, since the a-axis length increases toward the base layer 75 from the sub-collector layer 13, as shown in the intermediate graph, the polarization is varied so as to reduce the negative polarization toward the base layer 75 from the sub-collector layer 13. That is, the polarization amount is varied in the thickness direction. Then, in the case of the (0001) plane growth, as shown in the lower graph, positive electric charges are generated at an interface between the sub-collector layer 13 (GaN layer) and the InAlGaN layer 741. Then, negative electric charges are generated within the InAlGaN layer 741.

FIG. 17B shows the case where the collector layer 74 is formed of an InAlGaN layer 742 having an inclined composition satisfying $0 \leq xc2 = xc1 \leq 1$ and $0 \leq yc1 < yc2 \leq 1$. As shown in the upper graph, toward the base layer 75 from the sub-collector 13, the In composition increases while the Al composition of the InAlGaN layer 742 is constant. Further, since the a-axis length increases toward the base layer 75 from the sub-collector 13, the polarization amount is varied in the thickness direction as shown in the intermediate graph. Therefore, as shown in the lower graph, in the case of the (0001) plane growth, positive electric charges are generated at an interface between the sub-collector layer 13 (GaN layer) and the InAlGaN layer 742. Negative electric charges are generated within the InAlGaN layer 742. Negative electric charges are generated at an interface between the InAlGaN layer 742 and the base layer 75 (InGaN layer).

FIG. 17C shows the case where the collector layer 74 includes an InAlGaN layer 743 having an inclined composition satisfying $0 \leq xc2 < xc1 \leq 1$ and $0 \leq yc1 = yc2 \leq 1$. As shown in the upper graph, toward the base layer 75 from the sub-collector layer 13, the Al composition is reduced while the In composition of the InAlGaN layer 743 is constant. Further, since the a-axis length increases toward the base layer 75 from the sub-collector layer 13, the polarization amount is varied in the thickness direction as shown in the intermediate graph. Therefore, in the case of the (0001) plane growth, negative electric charges are generated within the InAlGaN layer 743.

Figure 18:
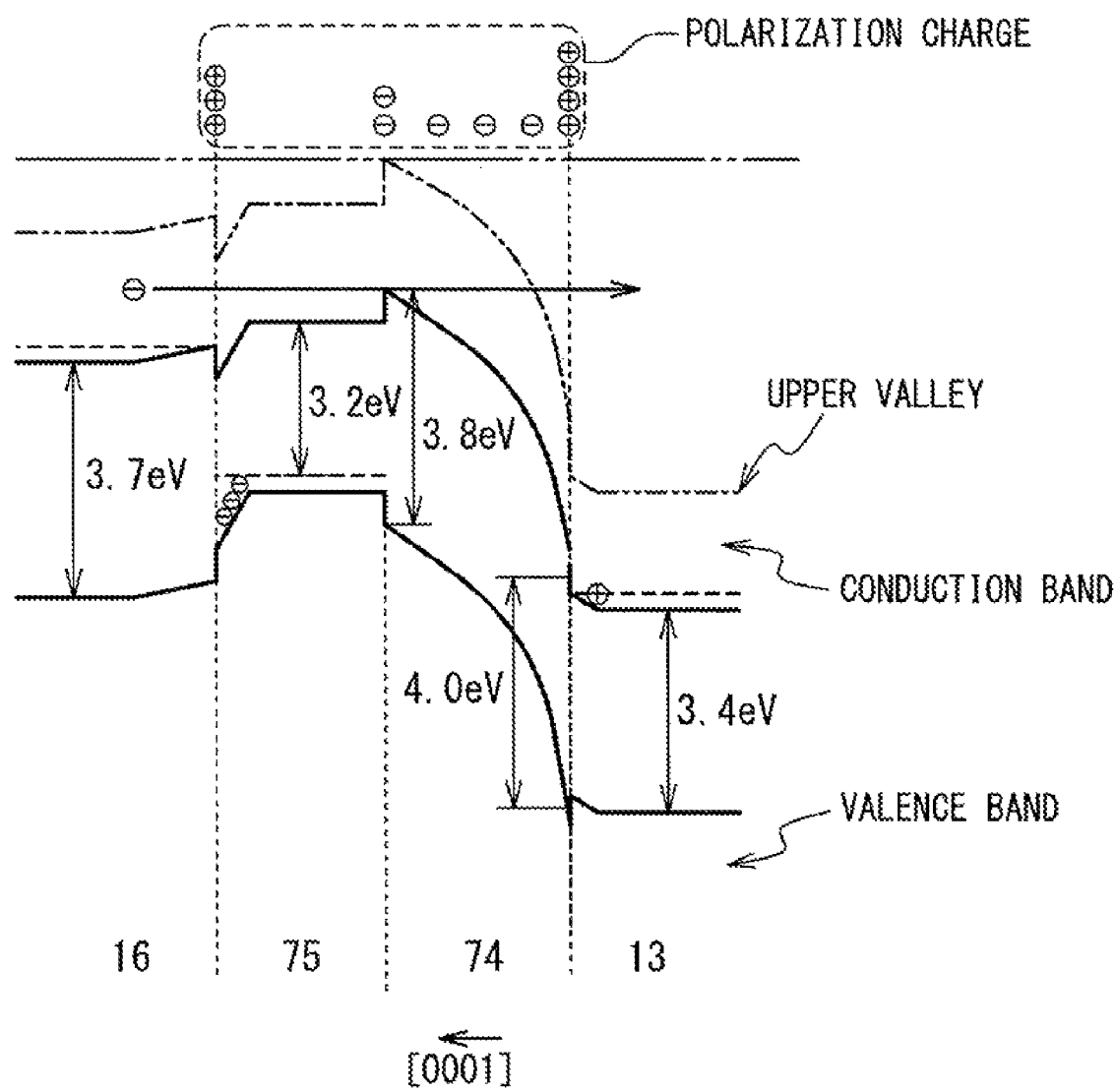
FIG. 18 is a diagram showing an example of an energy band of the bipolar transistor according to the seventh exemplary embodiment of the present invention.

As described above, since the negative electric charges are generated within the collector layer 74 (InAlGaN layer) in any of the cases shown in FIGS. 17A, 17B and 17C, there can be obtained an effect similar to that in the case of executing a p-type doping. The case of FIG. 17B is further explained as one example. FIG. 18 shows an example of an energy band diagram of the bipolar transistor according to the seventh exemplary embodiment of the present invention. This energy band diagram shows the case where a forward bias is applied between the base and the emitter (i.e., between the base layer 75 and the emitter layer 16) and a reverse bias is applied between the base and the collector (i.e., between the base layer 75 and the collector layer 74) in FIG. 17B. Here, the crystal composition is assumed to be xe=0.1, yb=0.05, xc1=xc2=0.2, yc1=0 and yc2=0.05.

Here, since $<xc>=0.2$ and $<yc>=0.025$, $|<xc>-4.6<yc>|=0.085$ is obtained and it satisfies (Formula 2). Each thickness of the base layer 75 (InGaN layer) and collector layer 74 (InAlGaN layer) is set to be the critical thickness of the dislocation generation or less. For example, it is sufficient that the thickness of the InGaN layer of the base layer 75 is set to be 100 nm and the thickness of the inclined composition InAlGaN layer of the collector layer 74 is set to be 500 nm.

An internal electric field having a convex potential protruded upward with respect to electrons is generated within the collector layer 74 (InAlGaN layer). Thus, the electric field concentration at the interface between the base and the collector (i.e., between the base layer 75 and the collector layer 74) is released. Simultaneously, since a position at which the electric field intensity is maximum is shifted to a side of the sub-collector layer 13, it becomes difficult for electrons injected into the collector layer 74 from the base layer 75 to be high energy.

Thus, valley scatterings are suppressed to thereby increase a carrier speed so that a cut-off frequency is improved.

Further, a band gap of the collector layer 74 becomes larger toward the sub-collector layer 13. The position at which the electric field intensity is maximum is also shifted to a side of the sub-collector layer 13. Therefore, the band gap in the position at which the electric field is maximum becomes large so that an avalanche breakdown is suppressed from occurring. Thus, the collector breakdown voltage can be also improved.

In the present exemplary embodiment, although the collector layer 74 includes an InAlGaN layer, the collector layer 74 may include an $In_{yc}AlGa_{1-yc}N$ layer so that the In composition yc may be increased toward the base layer 75 from the sub-collector layer 13. This corresponds to the case of setting to be xc1=xc2=0 in FIG. 16. Also, in this case, a negative electric field is generated within the collector layer 74 similarly so that the electric field concentration at the interface between the base and the collector is released and the cut-off frequency and the collector breakdown voltage can be improved.

In the present exemplary embodiment, although silicon carbide (SiC) is used as the substrate, other substrate such as silicon (Si), sapphire ($Al_2O_3$) or gallium nitride (GaN) may be used. Further, although AlGaN is used as a material of the emitter layer, other group III nitride semiconductor having a band gap not smaller than that of the base layer may be used. For example, AlN, InAlN and InAlGaN may be used. Further, although GaN or InGaN is used as a material of the base layer, other group III nitride semiconductor having a band gap not more than that of the collector layer may be used. For example, InN, AlGaN, InAlN and InAlGaN may be used. Furthermore, although GaN is used as a material of the contact layer and the sub-collector layer, other group III nitride semiconductor may be used. For example, InN, InGaN, InAlN, AlGaN and InAlGaN may be used.

In the above exemplary embodiments, the present invention is described taking a bipolar transistor of an emitter-up structure as an example. However, an essential point of the present invention resides in the fact that, a crystal growing direction with respect to a substrate surface is in parallel to a [0001] direction and a collector layer is formed of an (In)AlGaN having a composition modulation such as an a-axis length being increased toward a surface from the substrate so as to generate negative fixed electric charges. Even if a positional relationship between the base layer and the emitter layer is reverse, since negative electric charges are generated within the collector layer, a similar effect can be obtained. Consequently, in a bipolar transistor having a collector-up structure in which a crystal growing direction with respect to a substrate surface is in parallel to a [0001] direction, the collector layer may be formed of an (In)AlGaN having a composition modulation such as the a-axis length being increased toward a surface from the substrate.

As described above, the bipolar transistor of the present invention includes: a collector layer including a first nitride semiconductor represented by a composition formula $In_{yc}Al_{xc}Ga_{1-xc-yc}N$ ($0 \leq xc \leq 1$, $0 \leq yc \leq 1$, $0 < xc+yc \leq 1$) and formed to have a crystal growing direction with respect to a substrate surface being in parallel to a [0001] direction; a p-conductive-type base layer including a second nitride semiconductor; and an n-conductive-type emitter layer including a third nitride semiconductor. In this bipolar transistor, at least a partial portion of the collector layer is formed such that an a-axis of the first nitride semiconductor increases toward the surface from the substrate. Since negative electric charges are generated within the InAlGaN layer resulting from a polarization effect, the electric field concentration at a base-collector interface can be released. Since electrons injected into the collector layer from the base layer becomes hard to be high energy, valley scatterings are suppressed to thereby increase a carrier speed so that a cut-off frequency is improved. Moreover, since a band gap in a position where an electric field intensity becomes maximum is large, an avalanche breakdown is suppressed from occurring and the collector breakdown voltage can be also improved. Thus, there is a great contribution in increasing a breakdown voltage and a speed up of the bipolar transistor.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims. Also, each of the exemplary embodiments can be combined to each other in part or entirely so long as no contradiction in technique arises to each other.

This application is based upon and claims the benefit of priority from Japanese patent application No. 2008-270883 filed on Oct. 21, 2008, the disclosure of which is incorporated herein in its entirety by reference.

The invention claimed is:

1. A bipolar transistor comprising:
   a substrate;
   a collector layer configured to be formed above said substrate and include a first nitride semiconductor;
   a base layer with a p-conductive-type, configured to be formed on said collector layer and include a second nitride semiconductor; and
   an emitter layer with an n-conductive-type, configured to be formed on said base layer and include a third nitride semiconductor,
   wherein said collector layer, said base layer and the emitter layer are formed so that crystal growing directions with respect to a surface of said substrate are in parallel to a [0001] direction of said substrate,
   wherein said first nitride semiconductor includes:
   $In_{yc}Al_{xc}Ga_{1-xc-yc}N$ ($0 \leq xc \leq 1$, $0 \leq yc \leq 1$, $0 < xc+yc \leq 1$), and
   wherein, in said first nitride semiconductor, a length of an a-axis on a surface side is longer than a length of an a-axis on a substrate side.

2. The bipolar transistor according to claim 1, wherein said collector layer is formed such that an a-axis of said first nitride semiconductor increases toward said surface side from said substrate side.

3. The bipolar transistor according to claim 2, wherein said collector layer is formed such that an Al composition xc of said first nitride semiconductor decreases toward said surface side from said substrate side.

4. The bipolar transistor according to claim 3, wherein when an average Al composition and an average In composition of said first nitride semiconductor are <xc> and <yc>, respectively, said first nitride semiconductor satisfies a following expression 2:

$|<xc>-4.6<yc>|<0.5.$

5. The bipolar transistor according to claim 3, wherein said collector layer further includes:
a fourth nitride semiconductor configured to be provided in contact on said first nitride semiconductor,
wherein said fourth nitride semiconductor includes:

$Al_{xc2}Ga_{1-xc2}N \ (0 \leq xc2 < xc \leq 1).$

6. The bipolar transistor according to claim 5, wherein said base layer includes:

$In_{yb}Ga_{1-yb}N (0 \leq yb \leq 1).$

7. The bipolar transistor according to claim 2, wherein said collector layer is formed such that an In composition yc of said first nitride semiconductor increases toward said surface side from said substrate side.

8. The bipolar transistor according to claim 7, wherein when an average Al composition and an average In composition of said first nitride semiconductor are <xc> and <yc>, respectively, said first nitride semiconductor satisfies a following expression 2:

$|<xc>-4.6<yc>|<0.5.$

9. The bipolar transistor according to claim 1, wherein said collector layer, said base layer and said emitter layer are formed above said substrate in this order.

10. The bipolar transistor according to claim 1, wherein said collector layer and said base layer are formed such that a band gap of said first nitride semiconductor is larger than a band gap of said second nitride semiconductor at an interface between said collector layer and said base layer.

11. The bipolar transistor according to claim 1, further comprising:
a sub-collector with an n-conductive-type, configured to be formed in contact on said collector layer;
a first ohmic electrode configured to be electrically connected to said emitter;
a second ohmic electrode configured to be electrically connected to said base; and
a third ohmic electrode configured to be electrically connected to said sub-collector.

* * * * *